US012183498B2

(12) United States Patent
Kiyonaga et al.

(10) Patent No.: US 12,183,498 B2
(45) Date of Patent: Dec. 31, 2024

(54) POWER CONVERSION DEVICE

(71) Applicant: Mitsubishi Electric Corporation, Tokyo (JP)

(72) Inventors: Hiroyuki Kiyonaga, Tokyo (JP); Kenta Fujii, Tokyo (JP); Yuji Shirakata, Tokyo (JP); Tomohito Fukuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 675 days.

(21) Appl. No.: 17/608,678

(22) PCT Filed: May 20, 2020

(86) PCT No.: PCT/JP2020/019999
§ 371 (c)(1),
(2) Date: Nov. 3, 2021

(87) PCT Pub. No.: WO2020/241423
PCT Pub. Date: Dec. 3, 2020

(65) Prior Publication Data
US 2022/0215997 A1 Jul. 7, 2022

(30) Foreign Application Priority Data
May 27, 2019 (JP) .................................. 2019-098329

(51) Int. Cl.
*H01F 27/28* (2006.01)
*H01F 27/22* (2006.01)

(52) U.S. Cl.
CPC ......... *H01F 27/2804* (2013.01); *H01F 27/22* (2013.01); *H01F 2027/2814* (2013.01)

(58) Field of Classification Search
CPC ................. H01F 27/2804; H01F 27/22; H01F 2027/2814
See application file for complete search history.

(56) References Cited

U.S. PATENT DOCUMENTS

2002/0186545 A1* 12/2002 Fukada .............. H05K 7/14329
257/E23.098
2005/0270745 A1* 12/2005 Chen ................... H01F 27/2804
361/707
2012/0056569 A1 3/2012 Takamatsu et al.

FOREIGN PATENT DOCUMENTS

JP     H10125836 A      5/1998
JP     H10248198 A   *  9/1998
(Continued)

OTHER PUBLICATIONS

Office action issued in corresponding JP Application No. 2021-522273, mailed Sep. 27, 2022. 8 pages including 4 pages of English Translation.
(Continued)

*Primary Examiner* — Malcolm Barnes
(74) *Attorney, Agent, or Firm* — Buchanan Ingersoll & Rooney PC

(57) ABSTRACT

A power conversion device includes an electronic component, a first printed board, a first cooling body, a second printed board, a second cooling body, a third printed board, and a third cooling body. The second cooling body extends from a second principal surface toward a first principal surface of the first printed board. The third cooling body extends from a second principal surface toward the first principal surface of the first printed board.

17 Claims, 34 Drawing Sheets

(56) References Cited

FOREIGN PATENT DOCUMENTS

| | | | |
|---|---|---|---|
| JP | 2002325467 A | * | 11/2002 |
| JP | 2003037231 A | | 2/2003 |
| JP | 2008502293 A | | 1/2008 |
| JP | 4231626 B2 | | 3/2009 |
| JP | 2009165327 A | | 7/2009 |
| JP | 2010124607 A | * | 6/2010 |
| JP | 2010186907 A | | 8/2010 |
| JP | 2012005194 A | | 1/2012 |
| JP | 2014220335 A | | 11/2014 |
| WO | 2010137162 A1 | | 12/2010 |
| WO | 2015072036 A1 | | 5/2015 |

OTHER PUBLICATIONS

International Search Report (PCT/ISA/210) with translation and Written Opinion (PCT/ISA/237) mailed on Aug. 4, 2020, by the Japan Patent Office as the International Searching Authority for International Application No. PCT/JP2020/019999. (14 pages).

Office Action dated May 31, 2022, issued in corresponding Japanese Patent Application No. JP 2021-522273, 13 pages including 7 pages of English Translation.

* cited by examiner

POWER CONVERSION DEVICE

TECHNICAL FIELD

The present disclosure relates to a power conversion device and a method for manufacturing the power conversion device.

BACKGROUND ART

In general, the power conversion device includes electronic components such as a switching element, a rectifier element, and a magnetic component. The electronic components generate heat with operation of the power conversion device. The heat generated in the electronic components is transferred to a cooling body through a heat dissipation path, and is dissipated from the cooling body. In this way, temperatures of the electronic components are suppressed so as to be less than or equal to an allowable temperature of each electronic component.

In recent years, a calorific value of the electronic components mounted on the power conversion devices increases with increasing demand for downsizing and higher output of the power conversion device. For this reason, it is strongly required that heat dissipation of the power conversion device is enhanced.

As an example of the power conversion device, Japanese Patent No. 4231626 (PTL 1) describes an automobile motor drive device. In the automobile motor drive device described in PTL 1, among the electronic components accommodated in a housing, a power conversion element that is a high-heat generating component is disposed on a bottom surface of the housing. The bottom surface of the housing on which the power conversion element is disposed is integrated with the cooling body. A printed board on which a control element is mounted is fixed to a plate-shaped substrate installation portion formed inside the housing. The heat generated by the control element is transferred to the housing through the plate-shaped substrate installation portion.

CITATION LIST

Patent Literature

PTL 1: Japanese Patent No. 4231626

SUMMARY OF INVENTION

Technical Problem

In the automobile motor drive device described in PTL 1, the power conversion element that is the high-heat generating component is disposed on the bottom surface of the housing. Consequently, when a number of high-heat generating components increases due to an increase in the output of the power conversion device, it is necessary to increase an area of the bottom surface of the housing in order to dispose the high-heat generating components. As a result, a size of the power conversion device increases. Furthermore, in the automobile motor drive device described in PTL 1, the heat generated by the control element is transferred to the housing through the plate-shaped substrate installation portion. Consequently, a heat dissipation path becomes long. As a result, the heat dissipation is degraded.

The present disclosure has been made in view of the above problems, and an object of the present disclosure is to provide a power conversion device capable of suppressing an increase in a bottom area of the power conversion device and improving the heat dissipation, and a method for manufacturing the power conversion device.

Solution to Problem

A power conversion device according to an aspect of the present disclosure includes an electronic component, a first substrate, a first cooling body, a second substrate, a second cooling body, a third substrate, and a third cooling body. The electronic component includes a first component, a second component, and a third component. The first substrate includes a first principal surface on which the first component of the electronic component is mounted and a second principal surface opposite to the first principal surface. The first cooling body is thermally connected to the second principal surface of the first substrate. The second substrate includes a third principal surface on which the second component of the electronic component is mounted and a fourth principal surface opposite to the third principal surface. The second cooling body is thermally connected to the fourth principal surface of the second substrate. The third substrate includes a fifth principal surface on which the third component of the electronic component is mounted and a sixth principal surface opposite to the fifth principal surface. The third cooling body is thermally connected to the sixth principal surface of the third substrate. The second cooling body extends in a direction from the second principal surface toward the first principal surface of the first substrate. The third cooling body extends in the direction from the second principal surface toward the first principal surface of the first substrate.

Advantageous Effects of Invention

According to the power conversion device of the present disclosure, the electronic component is mounted not only on the first substrate but also on the second substrate and the third substrate. For this reason, even when the number of electronic components that are the high-heat generating components increases, the electronic components are mounted on the second substrate and the third substrate, whereby the first cooling body can be prevented from expanding. Consequently, it is possible to suppress the increase in the bottom area of the power conversion device. Furthermore, by mounting the electronic components on the second substrate and the third substrate, the heat dissipation path through which the heat generated by the electronic components mounted on the second substrate is transferred to the second cooling body can be shortened, and the heat dissipation path through which the heat generated by the electronic components mounted on the third substrate is transferred to the third cooling body can be shortened. Therefore, the heat dissipation can be improved.

DESCRIPTION OF EMBODIMENTS

Figure 1:
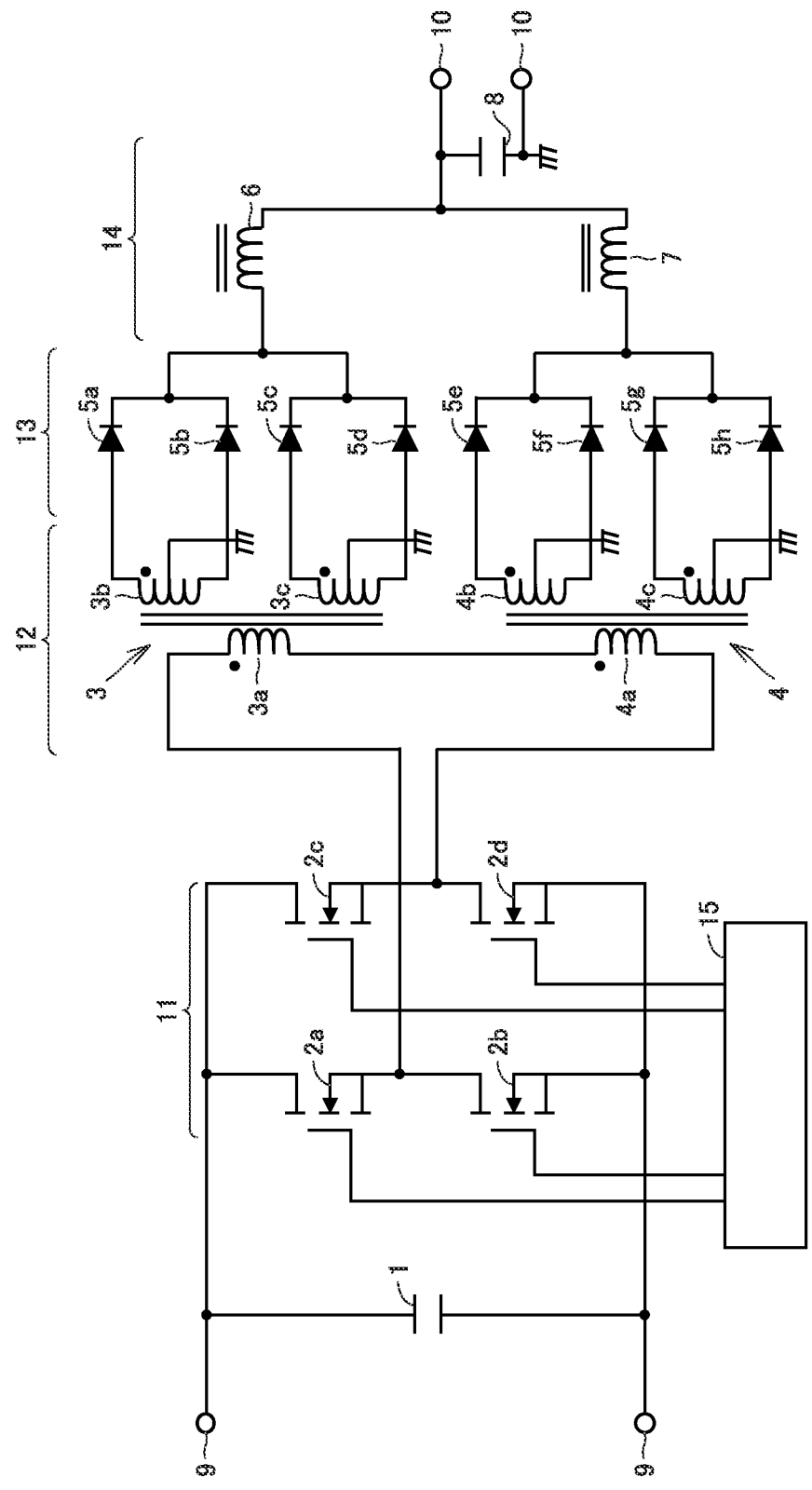
FIG. 1 is a circuit diagram of a power conversion device according to a first embodiment.

Hereinafter, an exemplary embodiment will be described with reference to the drawings. In the following description, the same or corresponding parts are denoted by the same reference numerals, and overlapping description will not be repeated.

First Embodiment

FIG. 1 is a circuit diagram illustrating an example of a power conversion device according to a first embodiment. For example, the power conversion device illustrated in the circuit diagram of FIG. 1 is a DC-DC converter that is mounted on an electric vehicle, converts an input voltage of a lithium ion battery of DC 100 V to 300 V into voltage of DC 12 V to 15 V, and outputs the voltage to charge a lead storage battery. The power conversion device illustrated in the circuit diagram of FIG. 1 includes an input capacitor 1, an inverter circuit unit 11 including four switching elements 2a, 2b, 2c, 2d, a transforming unit 12 including transformers 3, 4, a rectifier circuit unit 13 including eight rectifier elements 5a, 5b, 5c, 5d, 5e, 5f, 5g, 5h, a smoothing circuit unit 14 including reactors 6, 7 and a smoothing capacitor 8, an input terminal 9, an output terminal 10, and a control circuit unit 15. Each electronic component indicated by a circuit symbol in FIG. 1 may have an arbitrary number of a series configuration or a parallel configuration.

Each of switching elements 2a, 2b, 2c, 2d is a transistor, a metal oxide semiconductor field effect transistor (MOSFET), an insulated gate bipolar transistor (IGBT), or the like. Rectifier element 5 is a power semiconductor element such as a diode, the MOSFET, or a thyristor.

In the power conversion device illustrated in the circuit diagram of FIG. 1, control circuit unit 15 executes switching control of inverter circuit unit 11 to convert a DC voltage input from input terminal 9 into an AC voltage. Transforming unit 12 converts the AC voltage converted by inverter circuit unit 11 into an arbitrary voltage by a winding ratio of transformers 3, 4. Transformers 3, 4 electrically insulate input terminal 9 and output terminal 10 from each other. Rectifier circuit unit 13 converts the AC voltage supplied from transformers 3, 4 into the DC voltage again. Smoothing circuit unit 14 smooths the DC voltage converted by rectifier circuit unit 13 and stabilizes an output voltage.

In the power conversion device illustrated in the circuit diagram of FIG. 1, four switching elements 2a, 2b, 2c, 2d, transformers 3, 4, eight rectifier elements 5a, 5b, 5c, 5d, 5e, 5f, 5g, 5h, and reactors 6, 7 are high-heat generating components. It is necessary to dissipate heat generated by these high-heat generating components and to make temperatures of the high-heat generating components less than or equal to an allowable temperature of each component. For example, the allowable temperature of each component is greater than or equal to 100° C. and less than or equal to 120° C.

Because a large current flows through wiring electrically connecting these high-heat generating components, Joule heat is generated in the wiring by electric resistance of the wiring itself. Consequently, the wiring itself that electrically connects the high-heat generating component also generates a high calorific value. Consequently, when the high-heat generating component is electrically connected by a circuit pattern formed on or in a printed board, it is necessary to dissipate the heat generated by the circuit pattern to make the printed board less than or equal to the allowable temperature. The allowable temperature of the printed board is 100° C. or more and 120° C. or less.

Figure 2:
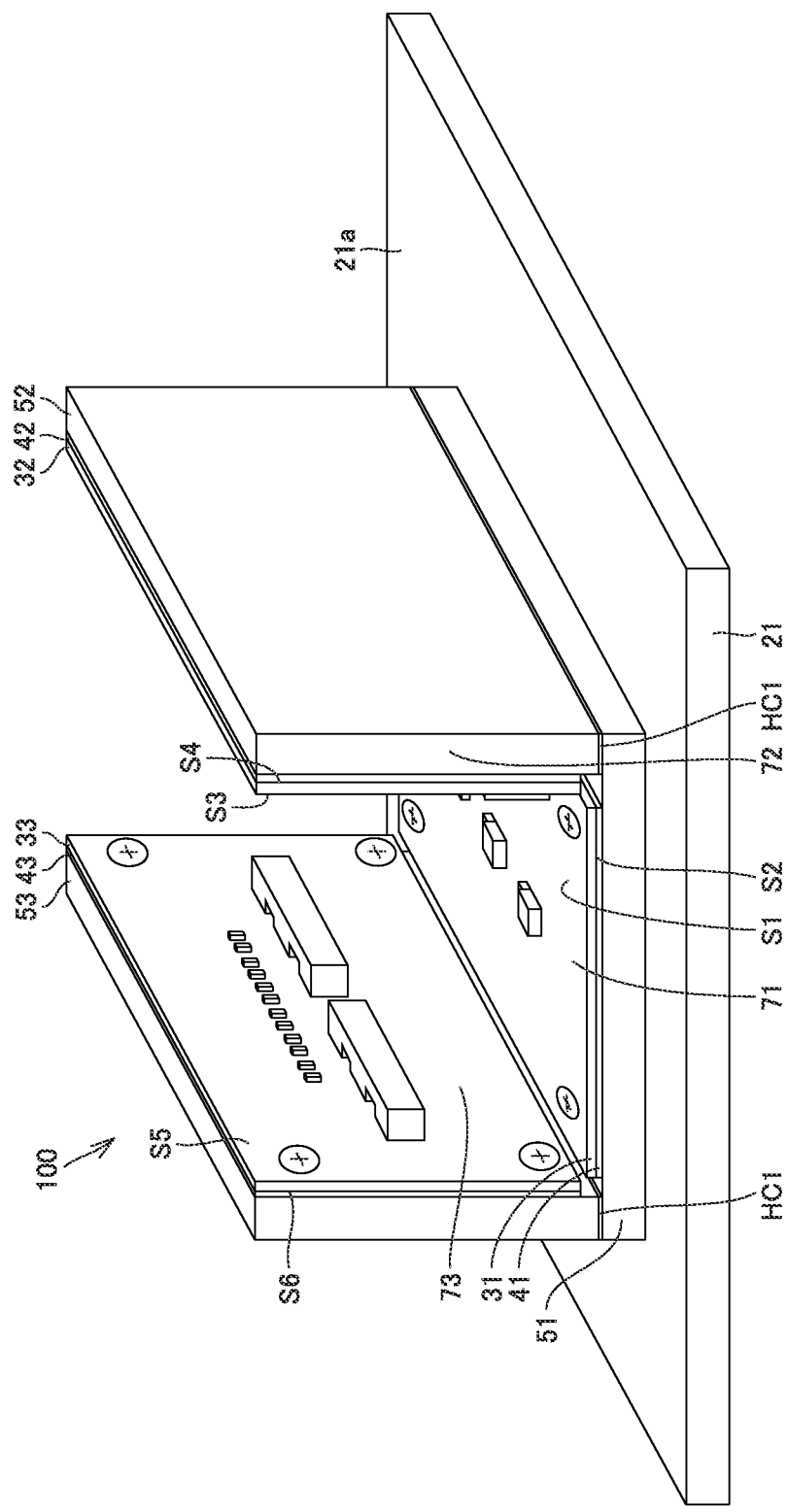
FIG. 2 is a perspective view schematically illustrating a configuration of the power conversion device of the first embodiment.
Figure 3:
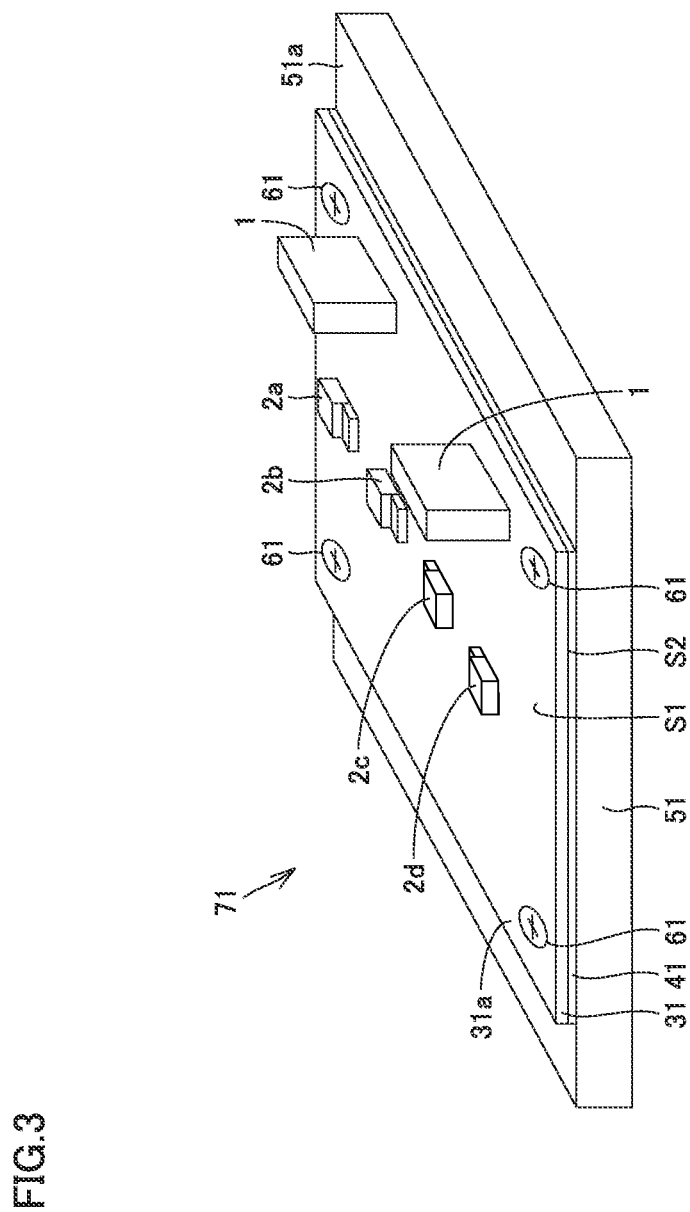
FIG. 3 is a perspective view schematically illustrating a configuration of a first printed board module of the power conversion device according to the first embodiment.
Figure 4:
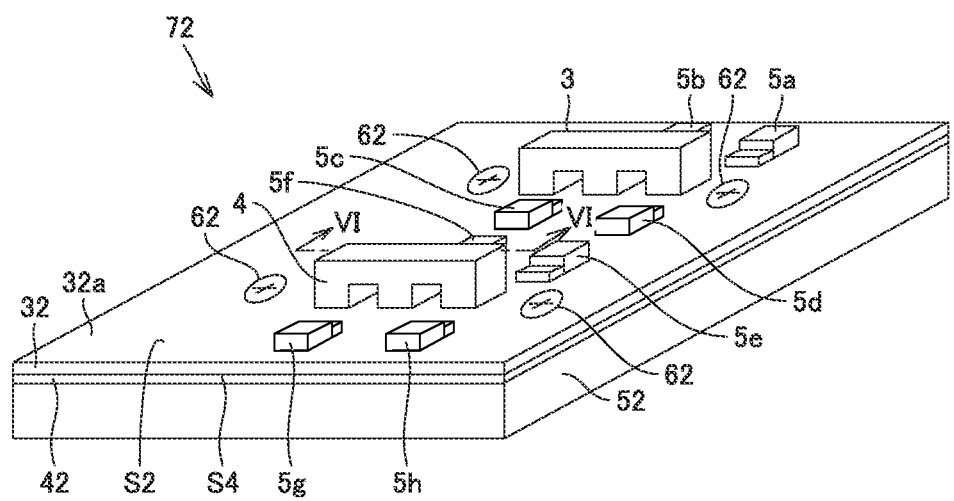
FIG. 4 is a perspective view schematically illustrating a configuration of a second printed board module of the power conversion device according to the first embodiment.
Figure 5:
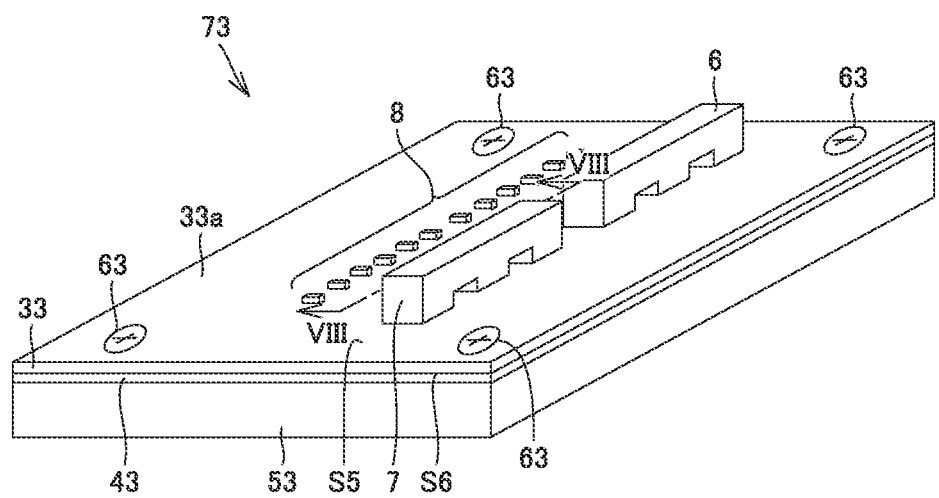
FIG. 5 is a perspective view schematically illustrating a configuration of a third printed board module of the power conversion device according to the first embodiment.

FIG. 2 is a perspective view illustrating a power conversion device 100 of the first embodiment. FIG. 3 is a perspective view illustrating a first printed board module 71 included in power conversion device 100. FIG. 4 is a perspective view illustrating a second printed board module 72 included in power conversion device 100. FIG. 5 is a perspective view illustrating a third printed board module 73 included in power conversion device 100.

As illustrated in FIG. 2, power conversion device 100 of the first embodiment includes an external cooling body 21, first printed board module 71, second printed board module 72, and third printed board module 73. First printed board module 71, second printed board module 72, and third printed board module 73 are electrically connected to one another by a harness 86 or the like as described later with reference to FIG. 11.

As illustrated in FIGS. 2 to 5, power conversion device 100 includes external cooling body 21, a first printed board 31, a first insulating member 41, a first cooling body 51, a first fixing member 61, a second printed board 32, a second insulating member 42, a second cooling body 52, a second fixing member 62, a third printed board 33, a third insulating member 43, a third cooling body 53, a third fixing member 63, and an electronic component. External cooling body 21 includes a principal surface 21a.

First printed board (first substrate) 31 includes a front surface (first principal surface) S1 on which the electronic component (first component) is mounted and a back surface (second principal surface) S2 facing first cooling body 51. Second principal surface S2 is opposite to first principal surface S1. First insulating member 41 is disposed between second principal surface S2 of first printed board 31 and first cooling body 51. First cooling body 51 is thermally connected to second principal surface S2 of first printed board 31 through first insulating member 41. First cooling body 51 is thermally coupled to external cooling body 21. External cooling body 21 is thermally connected to first cooling body 51. First cooling body 51 is thermally connected to second principal surface S2 of first printed board 31. First fixing member 61 is configured to fix first printed board 31 to first cooling body 51.

Second printed board (second substrate) 32 includes a front surface (third principal surface) S3 on which the electronic component (second component) is mounted and a back surface (fourth principal surface) S4 facing second cooling body 52. Fourth principal surface S4 is opposite to third principal surface S3. Second insulating member 42 is disposed between fourth principal surface S4 of second printed board 32 and second cooling body 52. Second cooling body 52 is thermally connected to fourth principal surface S4 of second printed board 32. Second cooling body 52 is thermally connected to fourth principal surface S4 of second printed board 32 through second insulating member 42. Second cooling body 52 is configured to extend vertically with a surface connected to a surface 51a of first cooling body 51 facing first printed board 31 as a bottom surface. Second cooling body 52 extends from second principal surface S2 of first printed board 31 toward first principal surface S1. Second cooling body 52 is thermally connected to first cooling body 51. Second fixing member 62 is configured to fix second printed board 32 to second cooling body 52.

Third printed board (third substrate) 33 includes a front surface (fifth principal surface) S5 on which an electronic component (third component) is mounted and a back surface (sixth principal surface) S6 facing third cooling body 53. Sixth principal surface S6 is opposite to fifth principal surface S5. Third insulating member 43 is disposed between sixth principal surface S6 of third printed board 33 and third cooling body 53. Third cooling body 53 is thermally connected to sixth principal surface S6 of third printed board 33 through third insulating member 43. Third cooling body 53 is thermally connected to sixth principal surface S6 of third printed board 33. Third cooling body 53 is configure to extend vertically with the surface connected to surface 51a of first cooling body 51 as the bottom surface. Third cooling body 53 extends from second principal surface S2 of first printed board 31 toward first principal surface S1. Third cooling body 53 is thermally connected to first cooling body 51. Third fixing member 63 is configured to fix third printed board 33 to third cooling body 53.

The vertical direction is a direction substantially perpendicular to principal surface 21a of external cooling body 21. First cooling body 51 constitutes the bottom surface of the support body of power conversion device 100. Second cooling body 52 and third cooling body 53 constitute side surfaces of the support body of power conversion device 100.

External cooling body 21 has thermal conductivity of 1.0 W/(m·K) or more, preferably 10.0 W/(m·K), and more preferably 100.0 W/(m·K) or more. External cooling body 21 is formed of a metal material such as copper, iron, aluminum, an iron alloy, and an aluminum alloy, resin having high thermal conductivity, or the like. External cooling body 21 may include a pipe passing cooling water therethrough. External cooling body 21 may include a dissipation fin or the like in order to promote heat dissipation to the surrounding atmosphere.

Each of first printed board 31, second printed board 32, and third printed board 33 may have a circuit pattern (not illustrated) formed on a surface or inside thereof. The circuit pattern has a thickness greater than or equal to 1 μm and less than or equal to 2000 μm. The circuit pattern is formed of a conductive material. For example, the circuit pattern is formed of copper, nickel, gold, aluminum, silver, tin, or an alloy thereof. For example, each of first printed board 31, second printed board 32, and third printed board 33 is made of a glass fiber-reinforced epoxy resin, a phenol resin, polyphenylene sulfide (PPS), or polyether ether ketone (PEEK). In other words, each of first printed board 31, second printed board 32, and third printed board 33 may be made of a material generally having low thermal conductivity. That is, each of first printed board 31, second printed board 32, and third printed board 33 may be a general-purpose printed board. First printed board 31, second printed board 32, and third printed board 33 may be made of a ceramic such as aluminum oxide, aluminum nitride, and silicon carbide.

Each of first insulating member 41, second insulating member 42, and third insulating member 43 has electric insulation. Each of first insulating member 41, second insulating member 42, and third insulating member 43 may have elasticity. Each of first insulating member 41, second insulating member 42, and third insulating member 43 may have a Young's modulus greater than or equal to 1 MPa and less than or equal to 100 MPa. Each of first insulating member 41, second insulating member 42, and third insulating member 43 has thermal conductivity greater than or equal to 0.1 W/(m·K), preferably greater than or equal to 1.0 W/(m·K). For example, each of first insulating member 41, second insulating member 42, and third insulating member 43 may be made of a rubber material such as silicon or urethane, a resin material such as acrylonitrile butadiene styrene (ABS), polybutylene terephthalate (PBT), polyphenylene sulfide (PPS), or phenol, a polymer material such as polyimide, a ceramic material such as alumina or aluminum nitride, or a phase change material mainly made of silicon. Each of first insulating member 41, second insulating member 42, and third insulating member 43 may be made of a material in which particles such as aluminum oxide, aluminum nitride, and boron nitride are mixed in a silicon resin.

Each of first cooling body 51, second cooling body 52, and third cooling body 53 has the thermal conductivity greater than or equal to 1.0 W/(m·K), preferably greater than or equal to 10.0 W/(m·K), more preferably greater than or equal to 100.0 W/(m·K). Each of first cooling body 51, second cooling body 52, and third cooling body 53 is made of a metal material such as copper, iron, aluminum, an iron alloy, or an aluminum alloy, or resin having the high thermal conductivity. Alternatively, first cooling body 51, second cooling body 52, and third cooling body 53 may be electrically connected to other members such that their respective potentials become the same potential as the ground. Each of second cooling body 52 and third cooling body 53 is connected to and fixed to first cooling body 51 directly or through another member. Each of second cooling body 52 and third cooling body 53 is thermally connected to first cooling body 51.

A heat conductive member (first heat conductive member) HC1 such as heat conductive grease, a heat conductive sheet, or a heat conductive adhesive may be disposed on a contact surface between first cooling body 51 and second cooling body 52 and a contact surface between first cooling body 51 and third cooling body 53. Heat conductive member (first heat conductive member) HC1 includes at least one of the heat conductive grease, the heat conductive sheet, and the heat conductive adhesive. First cooling body 51 is thermally connected to each of second cooling body 52 and third cooling body 53 through heat conductive member (first heat conductive member) HC1.

First cooling body 51 may be in surface contact with external cooling body 21. When first cooling body 51 and external cooling body 21 are brought into surface contact with each other, the heat conductive member such as the thermal conductive grease, the thermal conductive sheet, or the thermal conductive adhesive may be disposed on a contact surface between first cooling body 51 and external cooling body 21.

Because first cooling body 51 and external cooling body 21 are thermally coupled to each other, the heat dissipation to the heat generated in first printed board module 71 is higher than the heat dissipation to the heat generated in second printed board module 72 and third printed board module 73. Consequently, the electronic components disposed in first printed board module 71, second printed board module 72, and third printed board module 73 may be replaced, but preferably the electronic components (high-heat generating components) that generate a particularly high calorific value is disposed in first printed board module 71. In the first embodiment, assuming that each of switching elements 2a, 2b, 2c, 2d is particularly the high-heat generating component, each of switching elements 2a, 2b, 2c, 2d is disposed in first printed board module 71.

With reference to FIGS. 3 to 10, an example of first printed board module 71, second printed board module 72, and third printed board module 73 will be described below.

As illustrated in FIG. 3, first printed board module 71 includes first printed board 31, first insulating member 41, first cooling body 51, first fixing member 61, and the electronic component (first component). The electronic component (first component) is mounted on first printed board 31. The electronic component (first component) is each of switching elements 2a, 2b, 2c, 2d that are particularly high-heat generating components. First insulating member 41 is provided between first printed board 31 and first cooling body 51. First insulating member 41 is preferably in surface contact with first printed board 31 and first cooling body 51. First fixing member 61 fixes first printed board 31 to first cooling body 51.

Input capacitor 1 and switching elements 2a, 2b, 2c, 2d are mounted on a surface 31a of first printed board 31 opposite to the surface facing first cooling body 51. Input terminal 9 (not illustrated) is mounted on surface 31a. Other electronic components may be mounted on surface 31a. Other electronic components may be mounted on the surface of first printed board 31 facing first cooling body 51. The surface of first printed board 31 facing first cooling body 51 corresponds to second principal surface S2. Surface 31a of first printed board 31 opposite to the surface facing first cooling body 51 corresponds to first principal surface S1.

As illustrated in FIG. 4, second printed board module 72 includes second printed board 32, second insulating member 42, second cooling body 52, second fixing member 62, and the electronic component (second component). The electronic component (second component) is mounted on second printed board 32. The electronic components (second components) are, in particular, transformers 3, 4 and rectifier elements 5a, 5b, 5c, 5d, 5e, 5f, 5g, 5h, which are the high-heat generating components. Second insulating member 42 is provided between fourth principal surface S4 of second printed board 32 and second cooling body 52. Second insulating member 42 is preferably in surface contact with second printed board 32 and second cooling body 52. Second fixing member 62 fixes second printed board 32 to second cooling body 52.

Rectifier elements 5a, 5b, 5c, 5d, 5e, 5f, 5g, 5h, and transformers 3, 4 are mounted on surface 32a of second printed board 32 opposite to the surface facing second cooling body 52. Other electronic components may be mounted on surface 32a. Other electronic components may be mounted on the surface of second printed board 32 facing second cooling body 52. The surface of second printed board 32 facing second cooling body 52 corresponds to fourth principal surface S4. Surface 32a of second printed board 32 opposite to the surface facing second cooling body 52 corresponds to third principal surface S3.

Figure 6:
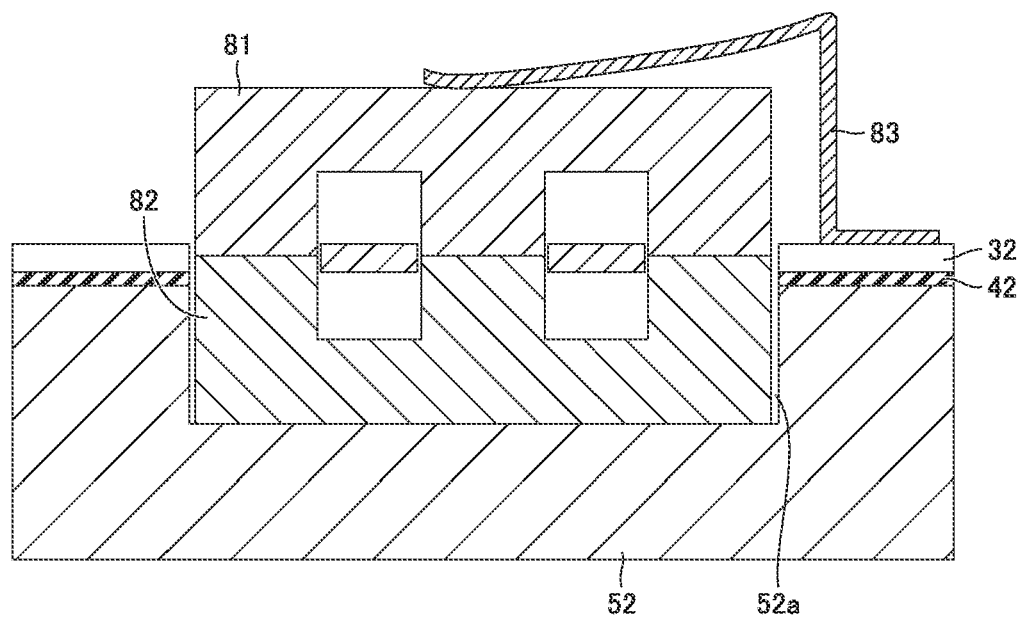
FIG. 6 is a sectional view taken along a line VI-VI in FIG. 4.

FIG. 6 is a sectional view taken along a line VI-VI in FIG. 4. As illustrated in FIG. 6, an upper core 81 and a lower core 82 are in contact with each other and magnetically coupled to each other in a hole made in second printed board 32. Coils 3a, 3b, 3c and coils 4a, 4b, 4c in FIG. 1 are formed on second printed board 32 by a wiring pattern (not illustrated). Transformer 3 is formed by upper core 81, lower core 82, and coils 3a, 3b, 3c in FIG. 1. Transformer 4 is formed by upper core 81, lower core 82, and coils 4a, 4b, 4c in FIG. 1.

For example upper core 81 and lower core 82 are ferrite cores such as manganese-zinc (Mn—Zn)-based ferrite cores or nickel-zinc (Ni—Zn)-based ferrite cores. Upper core 81 and lower core 82 may be amorphous cores or eye-dust cores.

Lower core 82 is provided in a groove 52a formed in second cooling body 52. A lower surface of lower core 82 is preferably in contact with second cooling body 52. A heat conductive member such as heat conductive grease, a heat conductive sheet, or a heat conductive adhesive may be disposed between the lower surface of lower core 82 and second cooling body 52. Lower core 82 may be fixed to second cooling body 52. Upper core 81 may be fixed to lower core 82 using an adhesive. An insulating member (not illustrated) may be disposed between lower core 82 and second cooling body 52.

As illustrated in FIG. 6, preferably upper core 81 and lower core 82 are pressed against second cooling body 52 by a pushing spring 83. Pushing spring 83 is fixed onto second printed board 32 using a screw (not illustrated) or the like. In this case, upper core 81 and lower core 82 are fixed to second cooling body 52, so that positional displacement can be prevented, and damage to upper core 81 and lower core 82 due to vibration can be prevented. An insulating member (not illustrated) may be disposed between upper core 81 and pushing spring 83.

Figure 7:
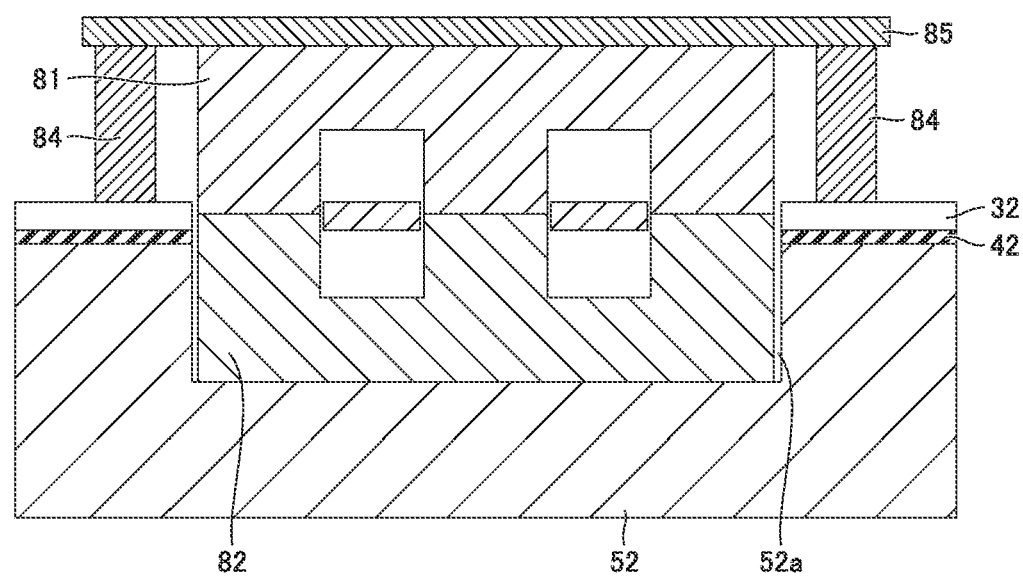
FIG. 7 is a sectional view corresponding to FIG. 6 of a first modification of the power conversion device according to the first embodiment.

As illustrated in FIG. 7, upper core 81 and lower core 82 may be pressed against second cooling body 52 by a strut 84 and a pressing plate 85. Pressing plate 85 is fixed to strut 84 so as to press upper core 81 against lower core 82. Strut 84 is fixed to second printed board 32. Strut 84 may pass through a hole (not illustrated) made in second printed board 32 to be fixed to second cooling body 52. In this case, upper core 81 and lower core 82 are fixed to second cooling body 52, so that positional displacement can be prevented, and damage to upper core 81 and lower core 82 due to vibration can be prevented. An insulating member (not illustrated) may be disposed between upper core 81 and pressing plate 85.

As illustrated in FIG. 5, third printed board module 73 includes third printed board 33, third insulating member 43, third cooling body 53, third fixing member 63, and the electronic component (third component). The electronic component (third component) is mounted on third printed board 33. The electronic components (third components) are particularly reactors 6, 7 that are high-heat generating components. Third insulating member 43 is provided between third printed board 33 and third cooling body 53. Third insulating member 43 is preferably in surface contact with third printed board 33 and third cooling body 53. Third fixing member 63 fixes third printed board 33 to third cooling body 53.

Smoothing capacitor 8 and reactors 6, 7 are mounted on surface 33a of third printed board 33 opposite to a surface facing third cooling body 53. Output terminal 10 (not illustrated) is mounted on surface 33a. Other electronic components may be mounted on surface 33a. Other electronic components may be mounted on the surface of third printed board 33 facing third cooling body 53. The surface of third printed board 33 facing third cooling body 53 corresponds to sixth principal surface S6. Surface 33a of third printed board 33 opposite to the surface facing third cooling body 53 corresponds to fifth principal surface S5.

Figure 8:
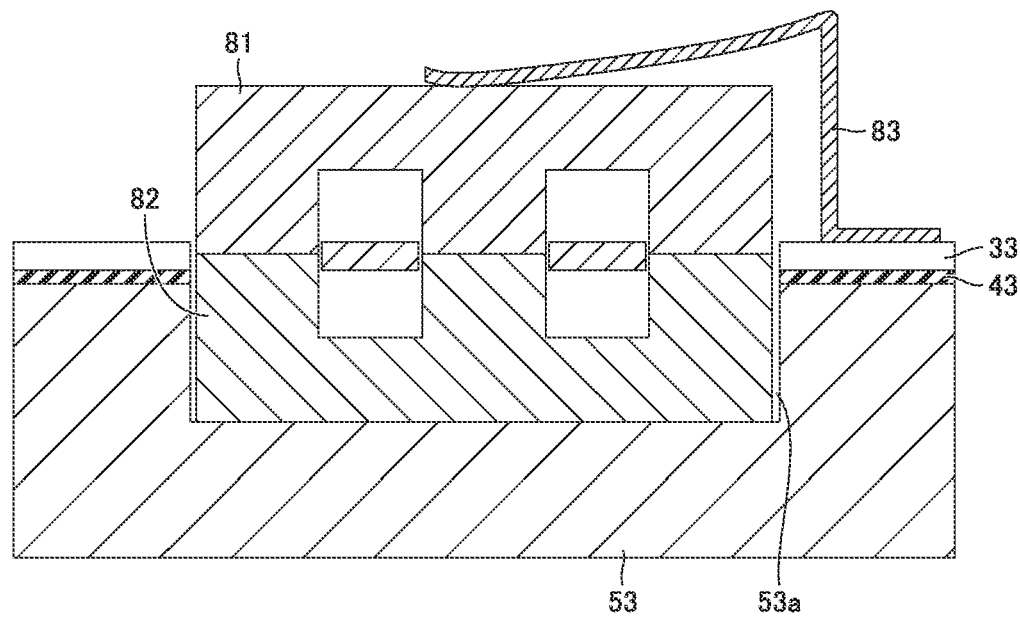
FIG. 8 is a sectional view taken along a line VIII-VIII in FIG. 5.

FIG. 8 is a sectional view taken along a line VIII-VIII in FIG. 5. As illustrated in FIG. 8, upper core 81 and lower core 82 are in contact with each other and magnetically coupled to each other in a hole made in third printed board 33. Reactors 6, 7 are formed by a wiring pattern (not illustrated) formed on third printed board 33, upper core 81, and lower core 82.

Lower core 82 is provided in a groove 53a formed in third cooling body 53. The lower surface of lower core 82 is preferably in contact with third cooling body 53. A heat conductive member such as heat conductive grease, a heat conductive sheet, or a heat conductive adhesive may be disposed between the lower surface of lower core 82 and third cooling body 53. Lower core 82 may be fixed to third cooling body 53. An insulating member (not illustrated) may be disposed between lower core 82 and third cooling body 53.

As illustrated in FIG. 8, preferably upper core 81 and lower core 82 are pressed against third cooling body 53 by pushing spring 83. Pushing spring 83 is fixed onto third printed board 33 using a screw (not illustrated) or the like. In this case, upper core 81 and lower core 82 are fixed to third cooling body 53, so that the positional displacement can be prevented, and the damage to upper core 81 and lower core 82 due to the vibration can be prevented. An insulating member (not illustrated) may be disposed between upper core 81 and pushing spring 83.

Figure 9:
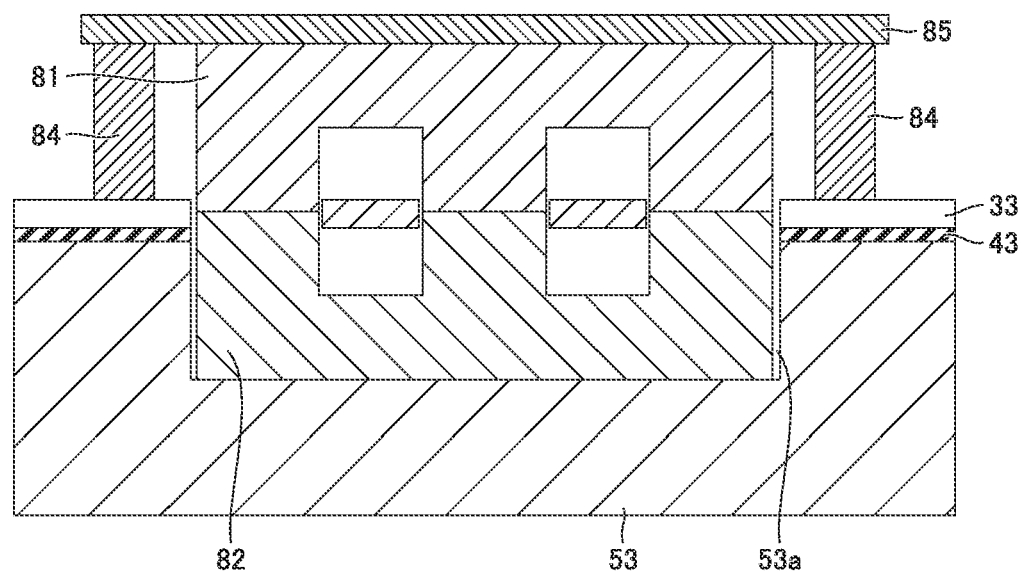
FIG. 9 is a sectional view corresponding to FIG. 8 of a second modification of the power conversion device according to the first embodiment.

As illustrated in FIG. 9, upper core 81 and lower core 82 may be pressed against third cooling body 53 by strut 84 and pressing plate 85. Pressing plate 85 is fixed to strut 84 so as to press upper core 81 against lower core 82. Strut 84 is fixed to third printed board 33. Strut 84 may pass through a hole (not illustrated) made in third printed board 33 to be fixed to third cooling body 53. In this case, upper core 81 and lower core 82 are fixed to third cooling body 53, so that the positional displacement can be prevented, and the damage to upper core 81, lower core 82, and the like due to the vibration can be prevented. An insulating member (not illustrated) may be disposed between upper core 81 and pressing plate 85.

Control circuit unit 15 in FIG. 1 may be mounted on one of first printed board 31, second printed board 32, and third printed board 33. Control circuit unit 15 may be divided and mounted on at least two of first printed board 31, second printed board 32, and third printed board 33.

Figure 10:
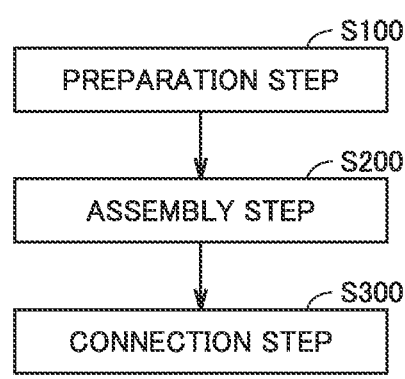
FIG. 10 is a flowchart illustrating a method for manufacturing the power conversion device of the first embodiment.
Figure 11:
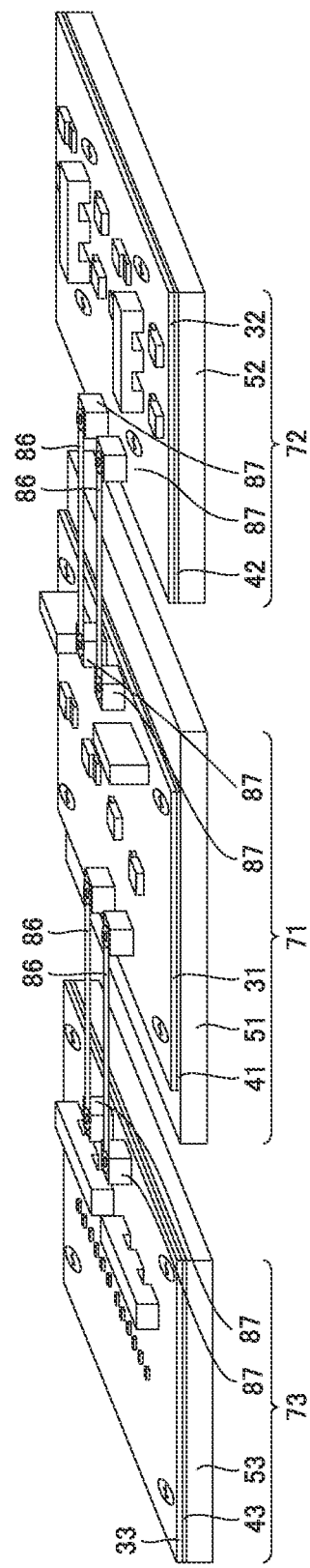
FIG. 11 is a perspective view illustrating electric connection between printed board modules of the power conversion device of the first embodiment.

With reference to FIGS. 10 and 11, a method for manufacturing power conversion device 100 of the first embodiment will be described below.

As illustrated in FIGS. 10 and 11, power conversion device 100 is manufactured through a preparation step S100, an assembly step S200, and a connection step S300.

The electronic components including the first component, the second component, and the third component, first printed board 31, second printed board 32, third printed board 33, first cooling body 51, second cooling body 52, and third cooling body 53 are prepared in preparation step S100.

First printed board module 71, second printed board module 72, and third printed board module 73 are assembled in assembly step S200. First printed board module 71, second printed board module 72, and third printed board module 73 are electrically connected by harness 86. That is, first printed board 31, second printed board 32, and third printed board 33 are electrically connected to one another.

Each of second printed board module 72 and third printed board module 73 is connected and fixed to first printed board module 71 in connection step S300.

In assembly step S200, each of first printed board module 71, second printed board module 72, and third printed board module 73 is manufactured through an electronic component mounting step, a printed board combination step, and a printed board fixing step.

The assembly step of first printed board module 71 will be described. In the electronic component mounting step, the electronic component (first component) is mounted on first principal surface S1 of first printed board 31 by flow soldering, reflow soldering, or the like. First cooling body 51, first insulating member 41, and first printed board 31 on which the electronic component is mounted on surface 31a are combined in the printed board combination step. At this point, first cooling body 51 is thermally connected to second principal surface S2 opposite to first principal surface S1 of first printed board 31. In the printed board fixing step, first printed board 31 is fixed to first cooling body 51 through first insulating member 41 by first fixing member 61.

The assembly step of second printed board module 72 will be described. In the electronic component mounting step, the electronic component (second component) is mounted on third principal surface S3 of second printed board 32 by flow soldering, reflow soldering, or the like. Second cooling body 52, second insulating member 42, second printed board 32 on which the electronic component is mounted on surface 32a, upper core 81, and lower core 82 are combined in the printed board combination step. At this point, second cooling body 52 is thermally connected to fourth principal surface S4 opposite to third principal surface S3 of second printed board 32. In the printed board fixing step, second printed board 32 is fixed to second cooling body 52 through second insulating member 42 by second fixing member 62.

The assembly step of third printed board module 73 will be described. In the electronic component mounting step, the electronic component (third component) is mounted on fifth principal surface S5 of third printed board 33 by flow soldering, reflow soldering, or the like. Third cooling body 53, third insulating member 43, third printed board 33 on which the electronic component is mounted on surface 33a, upper core 81, and lower core 82 are combined in the printed board combination step. At this point, third cooling body 53 is thermally connected to sixth principal surface S6 opposite to fifth principal surface S5 of third printed board 33. In the printed board fixing step, third printed board 33 is fixed to third cooling body 53 through third insulating member 43 by third fixing member 63.

In assembly step S200, the electronic component (second component) and the electronic component (third component) are fixed to the grooves provided in second printed board 32 and third printed board 33, respectively.

As illustrated in FIG. 11, second printed board module 72 and third printed board module 73 are electrically connected to first printed board module 71 by harness 86. For example, harness 86 includes round hole terminals at both ends. A terminal block 87 is mounted on each of first printed board 31, second printed board 32, and third printed board 33. First printed board 31, second printed board 32, and third printed board 33 are fixed to terminal block 87 while a screw (not illustrated) or the like is inserted into the round hole terminal of harness 86, whereby each of second printed board module 72 and third printed board module 73 may be electrically connected to first printed board module 71.

Terminal block 87 is preferably disposed such that a length of harness 86 is shortened. In other words, as illustrated in FIG. 11, preferably terminal block 87 is disposed such that a distance between two terminal blocks 87 connected by harness 86 is shortened. In this case, the electrical resistance of harness 86 can be reduced because the length of harness 86 is shortened. For this reason, Joule heat generated in harness 86 can be reduced.

In the connection step, second cooling body 52 included in second printed board module 72 and third cooling body 53 included in third printed board module 73 are connected and fixed to first cooling body 51 included in first printed board module 71 directly or through another member. In this case, each of second cooling body 52 and third cooling body 53 is disposed so as to extend from second principal surface S2 of first printed board 31 toward first principal surface S1. First cooling body 51 is thermally coupled to external cooling body 21 by a method such as surface contact with external cooling body 21.

In connection step S300, second cooling body 52 and third cooling body 53 are thermally connected to first cooling body 51.

Effects of power conversion device 100 of the first embodiment will be described below.

According to power conversion device 100 of the first embodiment, the electronic components are mounted not only on first printed board 31 but also on second printed board 32 and third printed board 33. For this reason, even when the number of electronic components that are the high-heat generating components increases, the electronic components are mounted on second printed board 32 and third printed board 33, whereby the expansion of first cooling body 51 can be suppressed. Consequently, it is possible to suppress an increase in the bottom area of power conversion device 100. The electronic components are mounted on second printed board 32 and third printed board 33, so that the heat dissipation path through which the heat generated by the electronic components mounted on second printed board 32 is transferred to second cooling body 52 can be shortened, and the heat dissipation path through which the heat generated by the electronic components mounted on third printed board 33 is transferred to third cooling body 53 can be shortened. Therefore, the heat dissipation can be improved.

Power conversion device 100 of the first embodiment includes external cooling body 21 thermally connected to first cooling body 51. A first heat dissipation path dissipating the heat to external cooling body 21 can be formed through first printed board 31, first insulating member 41, and first cooling body 51 as a heat dissipation path dissipating the heat generated by the circuit pattern formed on the surface or inside of first printed board 31 and the heat generated by switching elements 2a, 2b, 2c, 2d that are the high-heat generating components mounted on first printed board 31. For this reason, the heat dissipation of power conversion device 100 can be improved with respect to the heat generated in the circuit pattern formed on the surface or inside of first printed board 31 and the heat generated in the high-heat generating component mounted on first printed board 31. As a result, power conversion device 100 of the first embodiment can operate with high output.

When first insulating member 41 is brought into surface contact with first printed board 31 and first cooling body 51, the area of the contact surface between first insulating member 41 and first printed board 31 and the area of the contact surface between first insulating member 41 and first cooling body 51 can be widened, so that contact thermal resistance of the contact surface between first insulating member 41 and first printed board 31 and contact thermal resistance of the contact surface between first insulating member 41 and first cooling body 51 can be reduced to improve the heat dissipation of the first heat dissipation path. As a result, power conversion device 100 of the first embodiment can operate with high output.

A second heat dissipation path dissipating the heat to external cooling body 21 can be formed through second printed board 32, second insulating member 42, second cooling body 52, and first cooling body 51 as a heat dissipation path dissipating the heat generated by the circuit pattern formed on the surface or inside of second printed board 32, the heat generated by rectifier elements 5a, 5b, 5c, 5d, 5e, 5f, 5g, 5h that are the high-heat generating components mounted on second printed board 32, and the heat generated in transformers 3, 4. The length of the heat dissipation path can be shortened because the second heat dissipation path does not include the plate-shaped substrate installation portion as compared with the configuration described in PTL 1, so that the heat dissipation can be improved. For this reason, the heat dissipation of power conversion device 100 can be improved with respect to the heat generated in the circuit pattern formed on the surface or inside of second printed board 32 and the heat generated in the high-heat generating component mounted on second printed board 32. As a result, power conversion device 100 of the first embodiment can operate with high output.

When second insulating member 42 is brought into surface contact with second printed board 32 and second cooling body 52, the area of the contact surface between second insulating member 42 and second printed board 32 and the area of the contact surface between second insulating member 42 and second cooling body 52 can be widened, so that the contact thermal resistance of the contact surface between second insulating member 42 and second printed board 32 and the contact thermal resistance of the contact surface between second insulating member 42 and second cooling body 52 can be reduced to improve the heat dissipation of the second heat dissipation path. As a result, power conversion device 100 of the first embodiment can operate with high output.

As illustrated in FIG. 7, when upper core 81 and lower core 82 are fixed to second cooling body 52 by strut 84 fixed to second cooling body 52 and pressing plate 85, the heat generated in transformers 3, 4 can be dissipated to external cooling body 21 through pressing plate 85, strut 84, second cooling body 52, and first cooling body 51, so that the heat dissipation of power conversion device 100 can be improved with respect to the heat generated in transformers 3, 4. As a result, power conversion device 100 of the first embodiment can operate with high output.

When the lower surface of lower core 82 is in direct contact with second cooling body 52, when the lower surface of lower core 82 is in contact with second cooling body 52 through a heat conductive member such as thermal conductive grease, a thermal conductive sheet, or a thermal conductive adhesive, or when the lower surface of lower core 82 is in contact with second cooling body 52 through an insulating member, the heat generated in transformers 3, 4 can be dissipated to external cooling body 21 through second cooling body 52 and first cooling body 51, so that the heat dissipation of power conversion device 100 can be improved with respect to the heat generated in the transformers 3, 4. As a result, power conversion device 100 of the first embodiment can operate with high output.

A third heat dissipation path for dissipating heat to external cooling body 21 can be formed through third printed board 33, third insulating member 43, third cooling body 53, and first cooling body 51 as a heat dissipation path dissipating the heat generated by the circuit pattern formed on the surface or inside of third printed board 33 and the heat generated by reactors 6, 7 that are the high-heat generating components mounted on third printed board 33. The length of the heat dissipation path can be shortened because the third heat dissipation path does not include the plate-shaped substrate installation portion as compared with the configuration described in PTL 1, so that the heat dissipation can be improved. For this reason, the heat dissipation of power conversion device 100 can be improved with respect to the heat generated by the circuit pattern formed on the surface or inside third printed board 33 and the heat generated by the high-heat generating component mounted on third printed board 33. As a result, power conversion device 100 of the first embodiment can operate with high output.

When third insulating member 43 is brought into surface contact with third printed board 33 and third cooling body 53, the area of the contact surface between third insulating member 43 and third printed board 33 and the area of the contact surface between third insulating member 43 and third cooling body 53 can be widened, so that the contact thermal resistance of the contact surface between third insulating member 43 and third printed board 33 and the contact thermal resistance of the contact surface between third insulating member 43 and third cooling body 53 can be reduced to improve the heat dissipation of the third heat dissipation path. As a result, power conversion device 100 of the first embodiment can operate with high output.

As illustrated in FIG. 9, when upper core 81 and lower core 82 are fixed to third cooling body 53 by strut 84 fixed to third cooling body 53 and pressing plate 85, the heat generated in reactors 6, 7 can be dissipated to external cooling body 21 through pressing plate 85, strut 84, third cooling body 53, and first cooling body 51, so that the heat dissipation of power conversion device 100 can be improved with respect to the heat generated in reactors 6, 7. As a result, power conversion device 100 of the first embodiment can operate with high output.

When the lower surface of lower core 82 is in direct contact with third cooling body 53, when the lower surface of lower core 82 is in contact with third cooling body 53 through a heat conductive member such as thermal conductive grease, a thermal conductive sheet, or a thermal conductive adhesive, or when the lower surface of lower core 82 is in contact with third cooling body 53 through an insulating member, the heat generated in reactors 6, 7 can be dissipated to external cooling body 21 through third cooling body 53 and first cooling body 51, so that the heat dissipation of power conversion device 100 can be improved with respect to the heat generated in reactors 6, 7. As a result, power conversion device 100 of the first embodiment can operate with high output.

In addition, because first cooling body 51 and external cooling body 21 are thermally coupled, the heat dissipation of the first heat dissipation path is higher than the heat dissipation of the second heat dissipation path and the third heat dissipation path. Consequently, among the high-heat generating electronic components, the particularly high-heat generating electronic component is mounted on first printed board 31, so that the heat dissipation of power conversion device 100 can be improved with respect to the heat generated by these components. As a result, power conversion device 100 of the first embodiment can operate with high output.

Preferably first cooling body 51 has a small thickness in a direction substantially perpendicular to surface 31a of first printed board 31. As a result, the heat dissipation can be improved because the lengths of the first heat dissipation path, the second heat dissipation path, and the third heat dissipation path are shortened.

Preferably second cooling body 52 has a large thickness in a direction substantially perpendicular to surface 32a of second printed board 32. Consequently, the heat dissipation can be improved because the thermal resistance of second cooling body 52 included in the second heat dissipation path can be reduced.

Preferably third cooling body 53 has a large thickness in a direction substantially perpendicular to surface 33a of third printed board 33. Consequently, the heat dissipation can be improved because the thermal resistance of third cooling body 53 included in the third heat dissipation path can be reduced.

Figure 30:
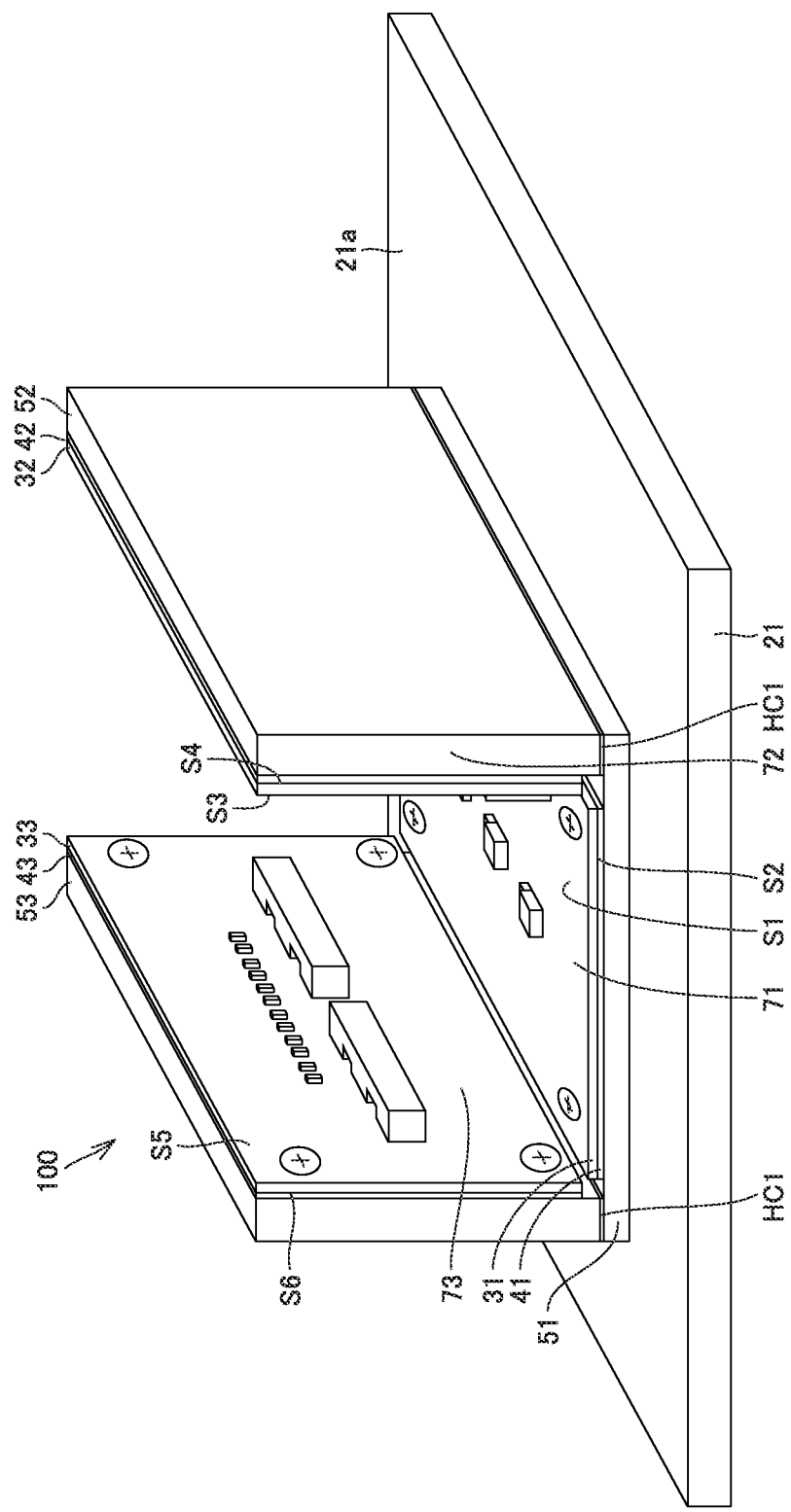
FIG. 30 is a perspective view schematically illustrating a configuration of a fifth modification of the power conversion device according to the first embodiment.

That is, referring to FIG. 30, the thickness of first cooling body 51 in the direction in which second principal surface S2 is opposite to first principal surface S1 is preferably smaller than the thickness of second cooling body 52 in the direction in which fourth principal surface S4 is opposite to third principal surface S3 and the thickness of third cooling body 53 in the direction in which sixth principal surface S6 is opposite to fifth principal surface S5.

In power conversion device 100 of the first embodiment, first cooling body 51 can be thermally connected to first printed board 31 through first insulating member 41. Second cooling body 52 can be thermally connected to second printed board 32 through second insulating member 42. Third cooling body 53 can be thermally connected to third printed board 33 through third insulating member 43.

In power conversion device 100 of the first embodiment, second cooling body 52 is thermally connected to first cooling body 51, and third cooling body 53 is thermally connected to first cooling body 51. For this reason, the heat generated by the electronic component mounted on second printed board 32 can be dissipated from first cooling body 51 through second cooling body 52, and the heat generated by the electronic component mounted on third printed board 33 can be dissipated from first cooling body 51 through third cooling body 53.

In power conversion device 100 of the first embodiment, first cooling body 51 is thermally connected to each of second cooling body 52 and third cooling body 53 through first heat conductive member HC1. For this reason, by first heat conductive member HC1, the heat transfer efficiency from second cooling body 52 to first cooling body 51 can be improved, and the heat transfer efficiency from third cooling body 53 to first cooling body 51 can be improved.

In power conversion device 100 of the first embodiment, first cooling body 51, second cooling body 52, and third cooling body 53 constitute the support body of the power conversion device 100. For this reason, the amount of the support body can be reduced as compared with the case where the cooling body does not also serve as the support body, and resultantly power conversion device 100 of the first embodiment can be downsized.

As described above, in power conversion device 100 of the first embodiment, first cooling body 51, second cooling body 52, and third cooling body 53 constitute the support body of power conversion device 100. However, a support body may be newly provided in addition to first cooling body 51 to third cooling body 53.

First cooling body 51, second cooling body 52, and third cooling body 53 may be used as a current path. For example, in a circuit diagram of a sixth modification of the power conversion device according to the first embodiment in FIG. 32, first cooling body 51, second cooling body 52, and third cooling body 53 may be used as the current path between A and A'. At this time, first cooling body 51, second cooling body 52, and third cooling body 53 are electrically connected to one another. At this point, the circuit pattern formed on the printed board and the cooling body are electrically connected to each other at a necessary portion. That is, first cooling body 51 and the circuit pattern formed on first printed board 31, second cooling body 52 and the circuit pattern formed on second printed board 32, and third cooling body 53 and the circuit pattern formed on third printed board 33 may be electrically connected as necessary. For the electric connection, for example, using a conductive material such as a metal screw as fixing members 61, 62, 63, first cooling body 51 and the circuit pattern formed on first printed board 31 may be electrically connected by first fixing member 61, second cooling body 52 and the circuit pattern formed on second printed board 32 may be electrically connected by second fixing member 62, and third cooling body 53 and the circuit pattern formed on third printed board 33 may be electrically connected by third fixing member 63.

The number of harnesses 86 electrically connecting first printed board module 71, second printed board module 72, and third printed board module 73 can be reduced using first cooling body 51, second cooling body 52, and third cooling body 53 as a current path, and a space where harness 86 is disposed can be reduced. As a result, power conversion device 100 of the first embodiment can be downsized.

Further, in the configuration described in PTL 1, the electronic component is disposed in a space formed in the housing. In the configuration described in PTL 1, similarly to the first embodiment, when the printed board is fixed to the bottom surface and the side surface of the housing through the insulating member, it is necessary to perform the disposition of the insulating member, the disposition of the printed board, the fixing of the printed board, and the electric connection between the printed boards in a substantially surrounded space, and workability is poor. As a result, the thickness of the insulating member is easy to vary, and thermal design considering the variation is required. When the terminal blocks fixed to the printed board are electrically connected to each other by the harness having the round hole terminals at both ends, the round hole terminals at both ends of the harness need to be screwed to the terminal blocks in the substantially surrounded space. For this reason, when the substantially surrounded space is narrow, the fixing position of the terminal block needs to be designed in consideration of screwing work.

On the other hand, the method for manufacturing power conversion device 100 of the first embodiment includes preparation step S100, assembly step S200, and connection step S300. Consequently, the work of disposing first insulating member 41, second insulating member 42, and third insulating member 43 on first cooling body 51 constituting the bottom surface of the support body and second cooling body 52 and third cooling body 53 constituting the side surfaces of the support body to fix first printed board 31, second printed board 32, and third printed board 33 and the work of electrically connecting first printed board module 71, second printed board module 72, and third printed board module 73 are not needed in the substantially enclosed space. As a result, it is not necessary to perform the thermal design in consideration of thickness variation of first insulating member 41, second insulating member 42, and third insulating member 43 due to poor workability. When terminal block 87 is electrically connected by harness 86 provided with the round hole terminals at both ends, it is not necessary to design the mounting position of the terminal block in consideration of the screwing work due to the fact that the round hole terminals at both ends of harness 86 need to be screwed to terminal block 87 in the substantially enclosed space.

In the method for manufacturing power conversion device 100 of the first embodiment, second cooling body 52 and third cooling body 53 are thermally connected to first cooling body 51 in connection step S300.

In the method for manufacturing power conversion device 100 of the first embodiment, in assembly step S200, the electronic component (second component) and the electronic component (third component) are fixed to the grooves provided in second printed board 32 and third printed board 33, respectively. For this reason, the electronic component can be certainly fixed.

Figure 12:
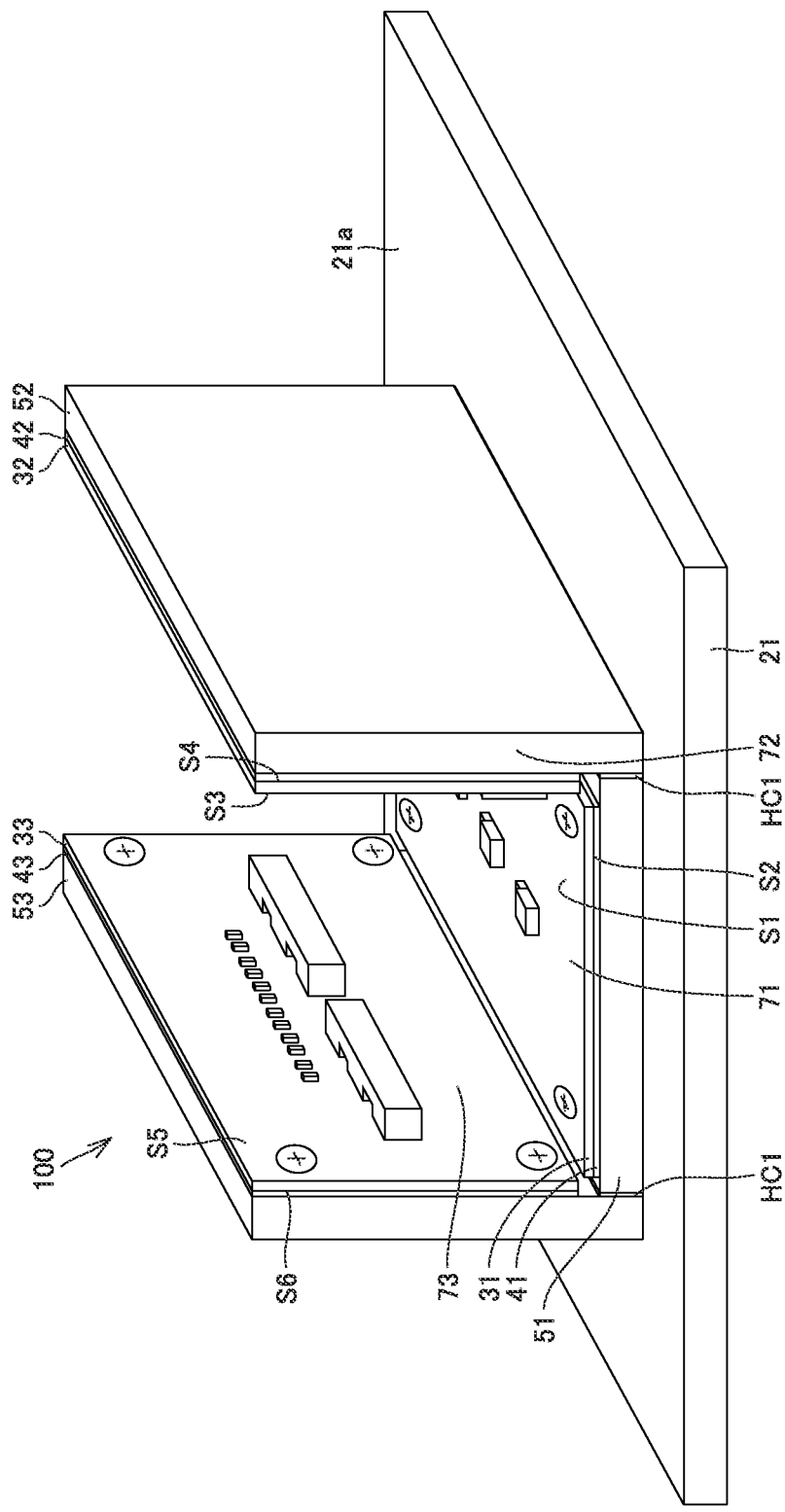
FIG. 12 is a perspective view schematically illustrating a configuration of a third modification of the power conversion device according to the first embodiment.

As illustrated in FIG. 12, power conversion device 100 of the first embodiment may be configured such that first cooling body 51 is disposed so as to be sandwiched between second cooling body 52 and third cooling body 53.

Figure 13:
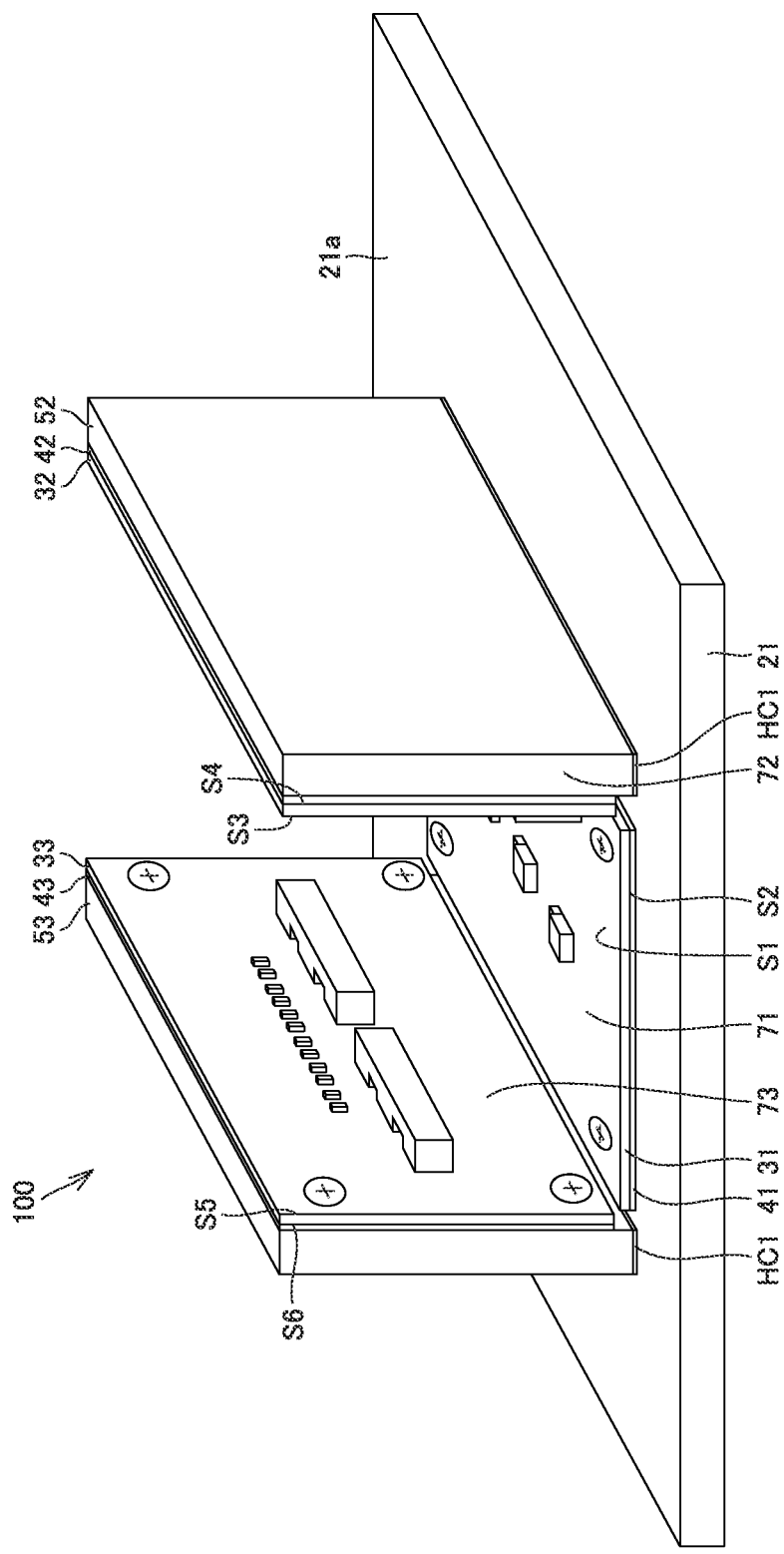
FIG. 13 is a perspective view schematically illustrating a configuration of a fourth modification of the power conversion device according to the first embodiment.

As illustrated in FIG. 13, in power conversion device 100 of the first embodiment, first cooling body 51 may be integrally formed with external cooling body 21. In this case, first cooling body 51 also serves as external cooling body 21. First cooling body 51 is thermally coupled to external cooling body 21 by a method such as integral formation with external cooling body 21.

Second Embodiment

Figure 14:
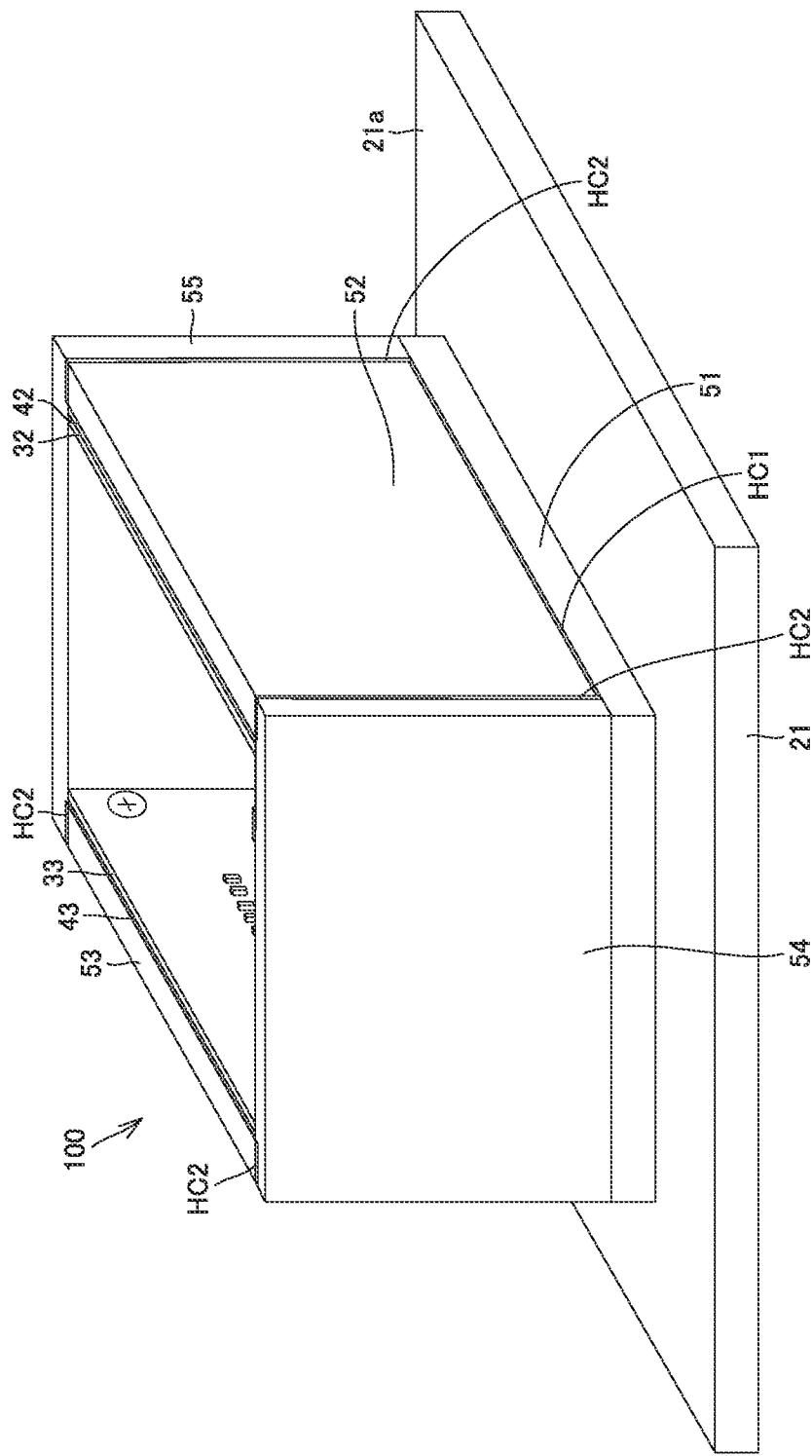
FIG. 14 is a perspective view schematically illustrating a configuration of a power conversion device according to a second embodiment.

With reference to FIG. 14, a power conversion device 100 according to a second embodiment will be described. The second embodiment has the same configuration, operation, and effect as those of the first embodiment described above unless otherwise specified. Consequently, the same components as those in the first embodiment are denoted by the same reference numerals, and the description thereof will not be repeated.

Power conversion device 100 of the second embodiment basically has the same configuration as power conversion device 100 of the first embodiment. Power conversion device 100 of the second embodiment is different from power conversion device 100 of the first embodiment in that power conversion device 100 of the second embodiment includes a fourth cooling body 54 and a fifth cooling body 55.

Fourth cooling body 54 is configure to extend vertically with a surface connected to surface 51a of first cooling body 51 as a bottom surface. Fourth cooling body 54 extends from second principal surface S2 of first printed board 31 toward first principal surface S1. Fifth cooling body 55 is configure to extend vertically with a surface connected to surface 51a of first cooling body 51 as a bottom surface. Fifth cooling body 55 extends from second principal surface S2 of first printed board 31 toward first principal surface S1.

Each of fourth cooling body 54 and fifth cooling body 55 is connected to and fixed to at least one of first cooling body 51, second cooling body 52, and third cooling body 53 directly or through another member. Each of fourth cooling body 54 and fifth cooling body 55 is thermally connected to each of first cooling body 51, second cooling body 52, and third cooling body 53. Fourth cooling body 54 is thermally connected to first cooling body 51, second cooling body 52, and third cooling body 53. Fifth cooling body 55 is thermally connected to first cooling body 51, second cooling body 52, and third cooling body 53.

A heat conductive member such as thermal conductive grease, a thermal conductive sheet, or thermal conductive adhesive (second heat conductive member) HC2 may be disposed on a contact surface between each of fourth cooling body 54 and fifth cooling body 55 and each of first cooling body 51, second cooling body 52, and third cooling body 53. Heat conductive member (second heat conductive member) HC2 includes at least one of heat conductive grease, the heat conductive sheet, and the heat conductive adhesive. Fourth cooling body 54 is thermally connected to each of first cooling body 51, second cooling body 52, and third cooling body 53 through heat conductive member (second heat conductive member) HC2. Fifth cooling body 55 is thermally connected to each of first cooling body 51, second cooling body 52, and third cooling body 53 through heat conductive member (second heat conductive member) HC2. Each of fourth cooling body 54 and fifth cooling body 55 constitutes the side surfaces of the support body of power conversion device 100.

Even in this case, power conversion device 100 of the second embodiment can obtain the effect equivalent to that of power conversion device 100 of the first embodiment. Furthermore, in addition to the second heat dissipation path dissipating the heat to external cooling body 21, the following two heat dissipation paths are formed through second printed board 32, second insulating member 42, second cooling body 52, and first cooling body 51 as a heat dissipation path dissipating the heat generated by the circuit pattern formed on the surface or inside of second printed board 32, the heat generated by rectifier elements 5a, 5b, 5c, 5d, 5e, 5f, 5g, 5h that are the high-heat generating components mounted on second printed board 32, and the heat generated by transformers 3, 4. A first is the heat dissipation path dissipates the heat to external cooling body 21 through second printed board 32, second insulating member 42, second cooling body 52, fourth cooling body 54, and first cooling body 51. A second is the heat dissipation path dissipates the heat to external cooling body 21 through second printed board 32, second insulating member 42, second cooling body 52, fifth cooling body 55, and first cooling body 51. For this reason, the heat dissipation of power conversion device 100 can be enhanced with respect to the heat generated by the circuit pattern formed on the surface or inside of second printed board 32 and the heat generated by the high-heat generating component mounted on second printed board 32. In addition to the third heat dissipation path dissipating the heat to external cooling body 21, the following two heat dissipation paths are formed through third printed board 33, third insulating member 43, third cooling body 53, and first cooling body 51 as a heat dissipation path dissipating the heat generated by the circuit pattern formed on the surface or inside of third printed board 33 and the heat generated by reactors 6, 7 that are the high-heat generating components mounted on third printed board 33. A first is the heat dissipation path dissipating the heat to external cooling body 21 through third printed board 33, third insulating member 43, third cooling body 53, fourth cooling body 54, and first cooling body 51. A second is the heat dissipation path dissipating the heat to external cooling body 21 through third printed board 33, third insulating member 43, third cooling body 53, fifth cooling body 55, and first cooling body 51. For this reason, the heat dissipation of power conversion device 100 can be enhanced with respect to the heat generated by the circuit pattern formed on the surface or inside third printed board 33 and the heat generated by the high-heat generating component mounted on third printed board 33. As a result, power conversion device 100 of the second embodiment can operate with high output.

In power conversion device 100 of the second embodiment, fourth cooling body 54 is thermally connected to each of first cooling body 51, second cooling body 52, and third cooling body 53 through heat conductive member (second heat conductive member) HC2. Fifth cooling body 55 is thermally connected to each of first cooling body 51, second cooling body 52, and third cooling body 53 through heat conductive member (second heat conductive member) HC2. For this reason, the heat transfer efficiency from fourth cooling body 54 to first cooling body 51, second cooling body 52, and third cooling body 53 can be improved by second heat conductive member HC2, and the heat transfer efficiency from fifth cooling body 55 to first cooling body 51, second cooling body 52, and third cooling body 53 can be improved.

Figure 15:
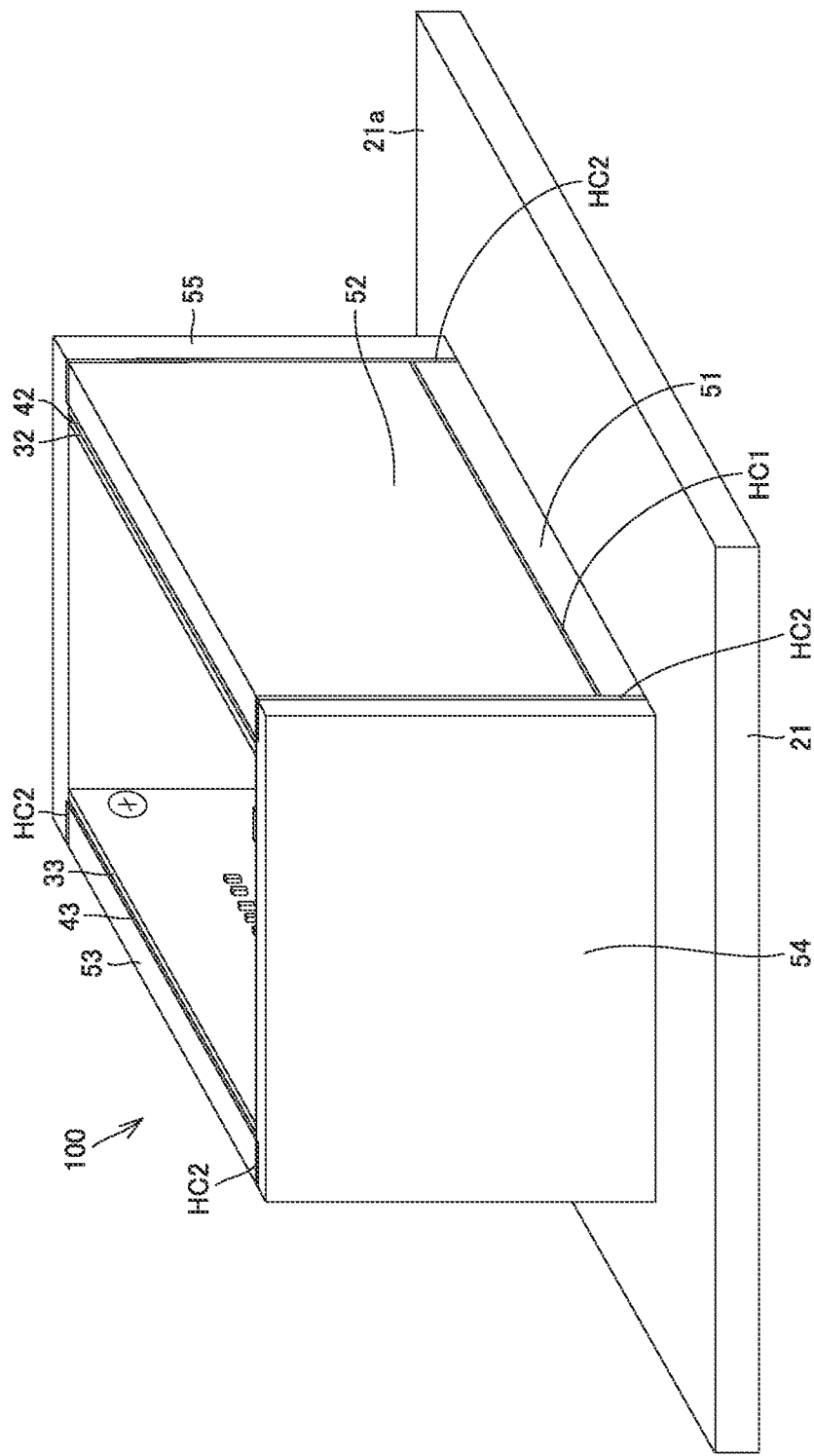
FIG. 15 is a perspective view schematically illustrating a configuration of a modification of the power conversion device according to the second embodiment.
Figure 16:
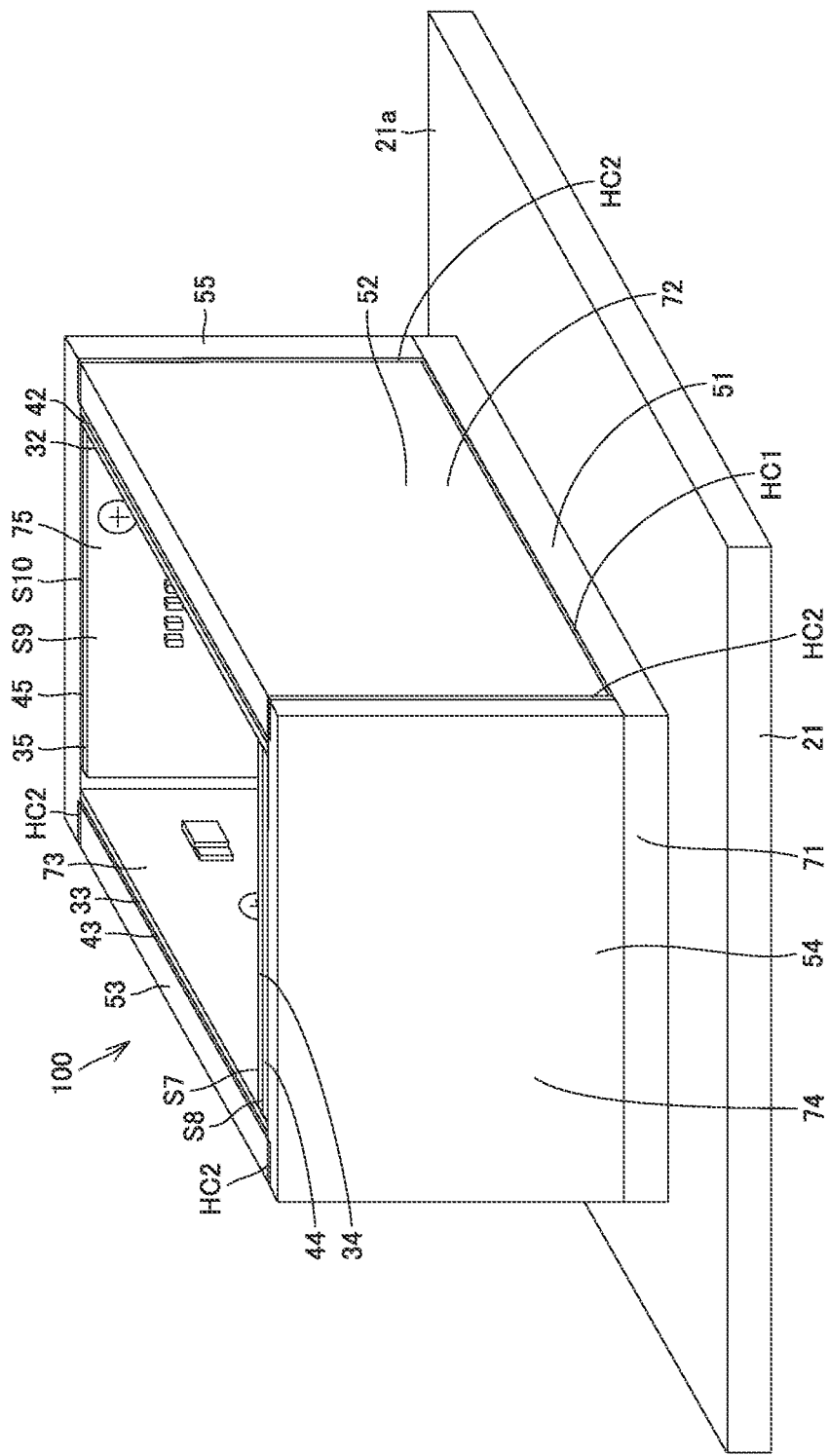
FIG. 16 is a perspective view schematically illustrating a configuration of a power conversion device according to a third embodiment.

As illustrated in FIG. 15, power conversion device 100 of the second embodiment may be configured such that first cooling body 51 is disposed so as to be sandwiched between fourth cooling body 54 and fifth cooling body 55.

In power conversion device 100 of the second embodiment, as illustrated in FIG. 14 or 15, second printed board 32 and third printed board 33 may be disposed such that surface (third principal surface) S3 of second printed board 32 on which the electronic component is mounted faces surface (fifth principal surface) S5 of third printed board 33 on which the electronic component is mounted.

When second printed board 32 and third printed board 33 are disposed such that surface (third principal surface) S3 of second printed board 32 on which the electronic component is mounted faces surface (fifth principal surface) S5 of third printed board 33 on which the electronic component is mounted, and when first cooling body 51 to fifth cooling body 55 are made of metal, first cooling body 51 to fifth cooling body 55 play a role of an electromagnetic shield that prevents power conversion device 100 from malfunctioning due to an electromagnetic wave noise emitted from another electronic device or the like disposed around power conversion device 100. In general, with the operation of the power conversion device, the electromagnetic wave is emitted from inverter circuit unit 11 including switching elements 2a, 2b, 2c, 2d, transforming unit 12 including transformers 3, 4, rectifier circuit unit 13 including eight rectifier elements 5a, 5b, 5c, 5d, 5e, 5f, 5g, 5h, and smoothing circuit unit 14 including reactors 6, 7 and smoothing capacitor 8. When second printed board 32 and third printed board 33 are disposed such that surface (third principal surface) S3 of second printed board 32 on which the electronic components are mounted faces surface (fifth principal surface) S5 of third printed board 33 on which the electronic components are mounted, and when first cooling body 51 to fifth cooling body 55 are made of metal, first cooling body 51 to fifth cooling body 55 play a role of an electromagnetic shield that prevents the electromagnetic wave noise emitted from inverter circuit unit 11 including switching elements 2a, 2b, 2c, 2d, transforming unit 12 including transformers 3, 4, rectifier circuit unit 13 including eight rectifier elements 5a, 5b, 5c, 5d, 5e, 5f, 5g, 5h, and smoothing circuit unit 14 including reactors 6, 7 and smoothing capacitor 8 from being discharged to the outside of power conversion device 100. For this reason, the amount of the electromagnetic shield can be reduced as compared with the case where the cooling body does not also serve as the electromagnetic shield, and resultantly power conversion device 100 of the second embodiment can be downsized.

As described above, in power conversion device 100 of the second embodiment, when second printed board 32 and third printed board 33 are disposed such that surface (third principal surface) S3 of second printed board 32 on which the electronic component is mounted faces surface (fifth principal surface) S5 of third printed board 33 on which the electronic component is mounted, and when first cooling body 51 to fifth cooling body 55 are made of metal, first cooling body 51 to fifth cooling body 55 also serve as the electromagnetic shield. However, an electromagnetic shield may be newly provided in addition to first cooling body 51 to fifth cooling body 55.

Third Embodiment

With reference to FIGS. 16 to 21, a power conversion device 100 according to the third embodiment will be described below. The third embodiment has the same configuration, operation, and effect as those of the second embodiment described above unless otherwise specified. Consequently, the same components as those in the second embodiment are denoted by the same reference numerals, and the description thereof will not be repeated.

Power conversion device 100 of the third embodiment basically has the same configuration as power conversion device 100 of the second embodiment. Power conversion device 100 of the third embodiment is different from power conversion device 100 of the second embodiment in that power conversion device 100 of the third embodiment includes a fourth printed board module 74 and a fifth printed board module 75.

Fourth printed board module 74 includes a fourth printed board 34, a fourth insulating member 44, a fourth cooling body 54, a fourth fixing member 64, and an electronic component.

Fourth printed board (fourth substrate) 34 includes a front surface (seventh principal surface) S7 on which the electronic component (fourth component) is mounted and a back surface (eighth principal surface) S8 facing fourth cooling body 54. Seventh principal surface S7 is opposite to eighth principal surface S8. Fourth insulating member 44 is disposed between eighth principal surface S8 of fourth printed board 34 and fourth cooling body 54. Fourth cooling body 54 is thermally connected to eighth principal surface S8 of fourth printed board 34. Fourth cooling body 54 is thermally connected to eighth principal surface S8 of fourth printed board 34 through fourth insulating member 44. Fourth cooling body 54 is configured to extend vertically with the surface connected to surface 51a of first cooling body 51 facing first printed board 31 as the bottom surface. Fourth cooling body 54 extends from second principal surface S2 of first printed board 31 toward first principal surface S1. Fourth cooling body 54 is thermally connected to each of first cooling body 51, second cooling body 52, and third cooling body 53. Fourth fixing member 64 is configured to fix fourth printed board 34 to fourth cooling body 54.

Fifth printed board module 75 includes a fifth printed board 35, a fifth insulating member 45, a fifth cooling body 55, a fifth fixing member 65, and an electronic component.

Fifth printed board (fifth substrate) 35 has a front surface (ninth principal surface) S9 on which an electronic component (fifth component) is mounted and a back surface (tenth principal surface) S10 facing fifth cooling body 55. Ninth principal surface S9 is opposite to tenth principal surface S10. Fifth insulating member 45 is disposed between tenth principal surface S10 of fifth printed board 35 and fifth cooling body 55. Fifth cooling body 55 is thermally connected to tenth principal surface S10 of fifth printed board 35. Fifth cooling body 55 is thermally connected to tenth principal surface S10 of fifth printed board 35 through fifth insulating member 45. Fifth cooling body 55 is configured to extend vertically with the surface of first cooling body 51 connected to surface 51a facing first printed board 31 as the bottom surface. Fifth cooling body 55 extends from second principal surface S2 of first printed board 31 toward first principal surface S1. Fifth cooling body 55 is thermally connected to each of first cooling body 51, second cooling body 52, and third cooling body 53. Fifth fixing member 65 is configured to fix fifth printed board 35 to fifth cooling body 55.

Power conversion device 100 of the third embodiment includes first printed board module 71, second printed board module 72, third printed board module 73, fourth printed board module 74, and fifth printed board module 75. First printed board module 71, second printed board module 72, third printed board module 73, fourth printed board module 74, and fifth printed board module 75 are electrically connected to one another by a harness or the like. That is, first printed board 31, second printed board 32, third printed board 33, fourth printed board 34, and fifth printed board 35 are electrically connected to one another.

With reference to FIGS. 17 to 21, examples of first printed board module 71, second printed board module 72, third printed board module 73, fourth printed board module 74, and fifth printed board module 75 in power conversion device 100 of the third embodiment will be described below.

Figure 17:
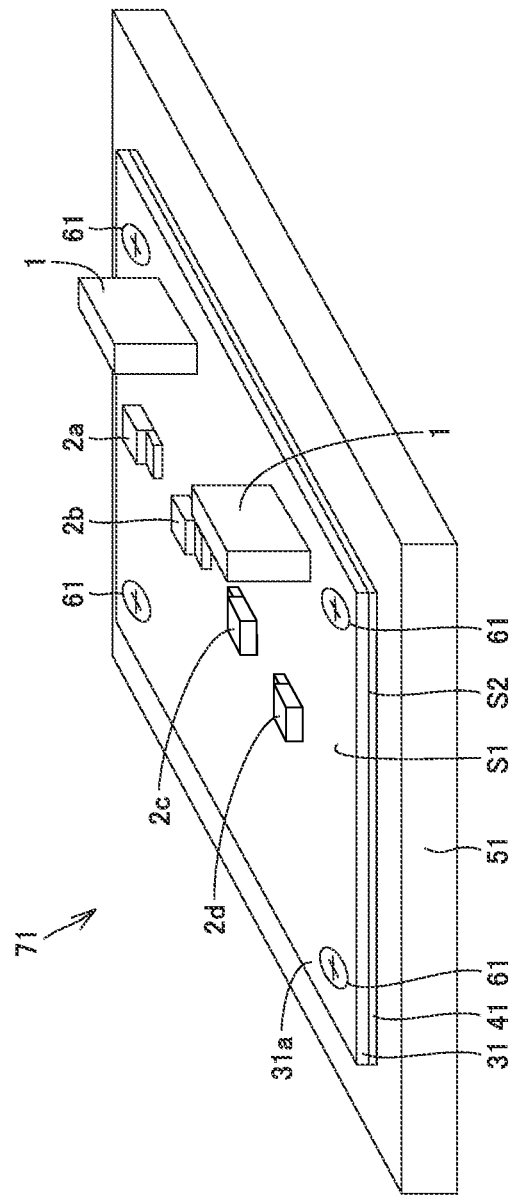
FIG. 17 is a perspective view schematically illustrating a configuration of a first printed board module of the power conversion device according to the third embodiment.

As illustrated in FIG. 17, first printed board module 71 includes first printed board 31, first insulating member 41, first cooling body 51, first fixing member 61, and an electronic component. The electronic component is mounted on first printed board 31. First insulating member 41 is disposed between first printed board 31 and first cooling body 51. First fixing member 61 fixes first printed board 31 to first cooling body 51.

Input capacitor 1 and switching elements 2a, 2b, 2c, 2d are mounted on a surface 31a of first printed board 31 opposite to the surface facing first cooling body 51. Input terminal 9 (not illustrated) is mounted on surface 31a. Other electronic components may be mounted on surface 31a. Other electronic components may be mounted on the surface of first printed board 31 facing first cooling body 51.

Figure 18:
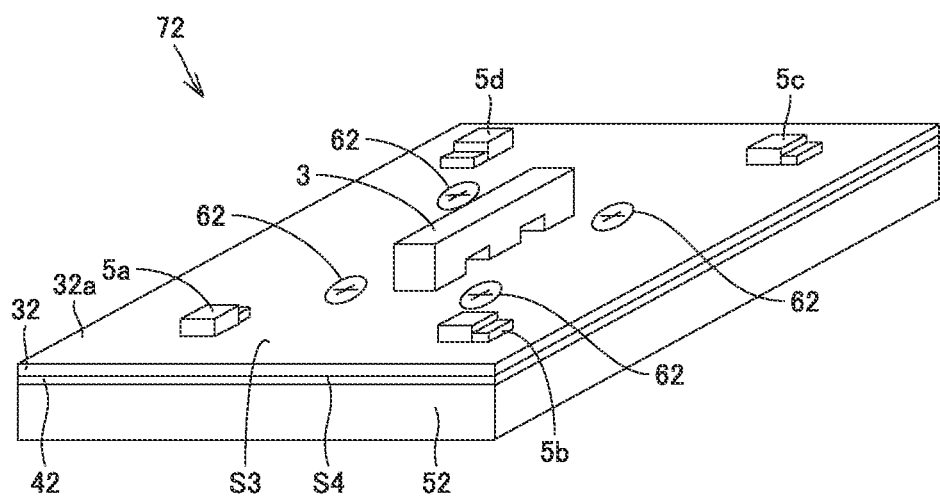
FIG. 18 is a perspective view schematically illustrating a configuration of a second printed board module of the power conversion device according to the third embodiment.

As illustrated in FIG. 18, second printed board module 72 includes second printed board 32, second insulating member 42, second cooling body 52, second fixing member 62, and an electronic component. The electronic component is mounted on second printed board 32. Second insulating member 42 is disposed between second printed board 32 and second cooling body 52. Second fixing member 62 fixes second printed board 32 to second cooling body 52.

Rectifier elements 5a, 5b, 5c, 5d and transformer 3 are mounted on surface 32a of second printed board 32 opposite to the surface facing second cooling body 52. Other electronic components may be mounted on surface 32a. Other electronic components may be mounted on the surface of second printed board 32 facing second cooling body 52.

Figure 19:
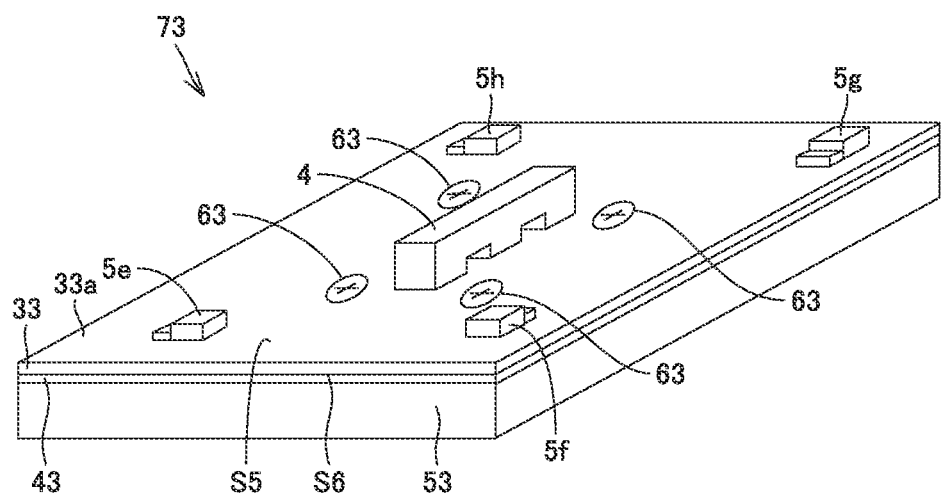
FIG. 19 is a perspective view schematically illustrating a configuration of a third printed board module of the power conversion device according to the third embodiment.

As illustrated in FIG. 19, third printed board module 73 includes third printed board 33, third insulating member 43, third cooling body 53, third fixing member 63, and an electronic component. The electronic component is mounted on third printed board 33. Third insulating member 43 is disposed between third printed board 33 and third cooling body 53. Third fixing member 63 fixes third printed board 33 to third cooling body 53.

Rectifier elements 5e, 5f, 5g, 5h and transformer 4 are mounted on surface 33a of third printed board 33 opposite to the surface facing third cooling body 53. Other electronic components may be mounted on surface 33a. Other electronic components may be mounted on the surface of third printed board 33 facing third cooling body 53.

Figure 20:
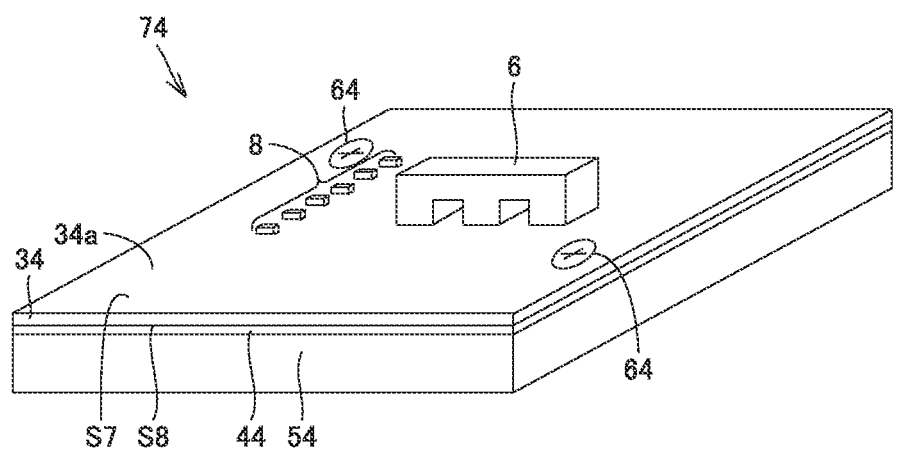
FIG. 20 is a perspective view schematically illustrating a configuration of a fourth printed board module of the power conversion device according to the third embodiment.

As illustrated in FIG. 20, fourth printed board module 74 includes fourth printed board 34, fourth insulating member 44, fourth cooling body 54, fourth fixing member 64, and an electronic component (fourth component). The electronic component (fourth component) is mounted on fourth printed board 34. The electronic component (fourth component) is particularly reactor 6 that is the high-heat generating component. Fourth insulating member 44 is disposed between fourth printed board 34 and fourth cooling body 54. Fourth fixing member 64 fixes fourth printed board 34 to fourth cooling body 54. Fourth insulating member 44 is preferably in surface contact with fourth printed board 34 and fourth cooling body 54.

Smoothing capacitor 8 and reactor 6 are mounted on surface 34a of fourth printed board 34 opposite to the surface facing fourth cooling body 54. Output terminal 10 (not illustrated) is mounted on surface 34a. Other electronic components may be mounted on surface 34a. The surface of fourth printed board 34 facing fourth cooling body 54 corresponds to eighth principal surface S8. Surface 34a of fourth printed board 34 opposite to the surface facing fourth cooling body 54 corresponds to seventh principal surface S7. Other electronic components may be mounted on the surface of fourth printed board 34 facing fourth cooling body 54.

Figure 21:
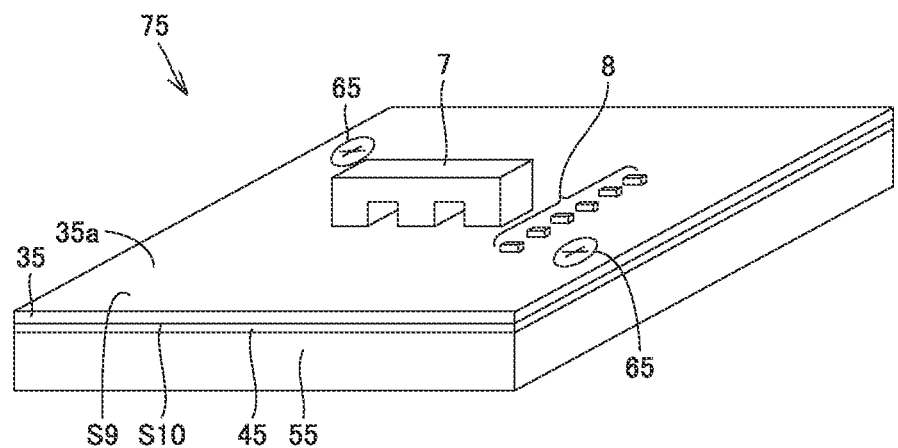
FIG. 21 is a perspective view schematically illustrating a configuration of a fifth printed board module of the power conversion device according to the third embodiment.
Figure 22:
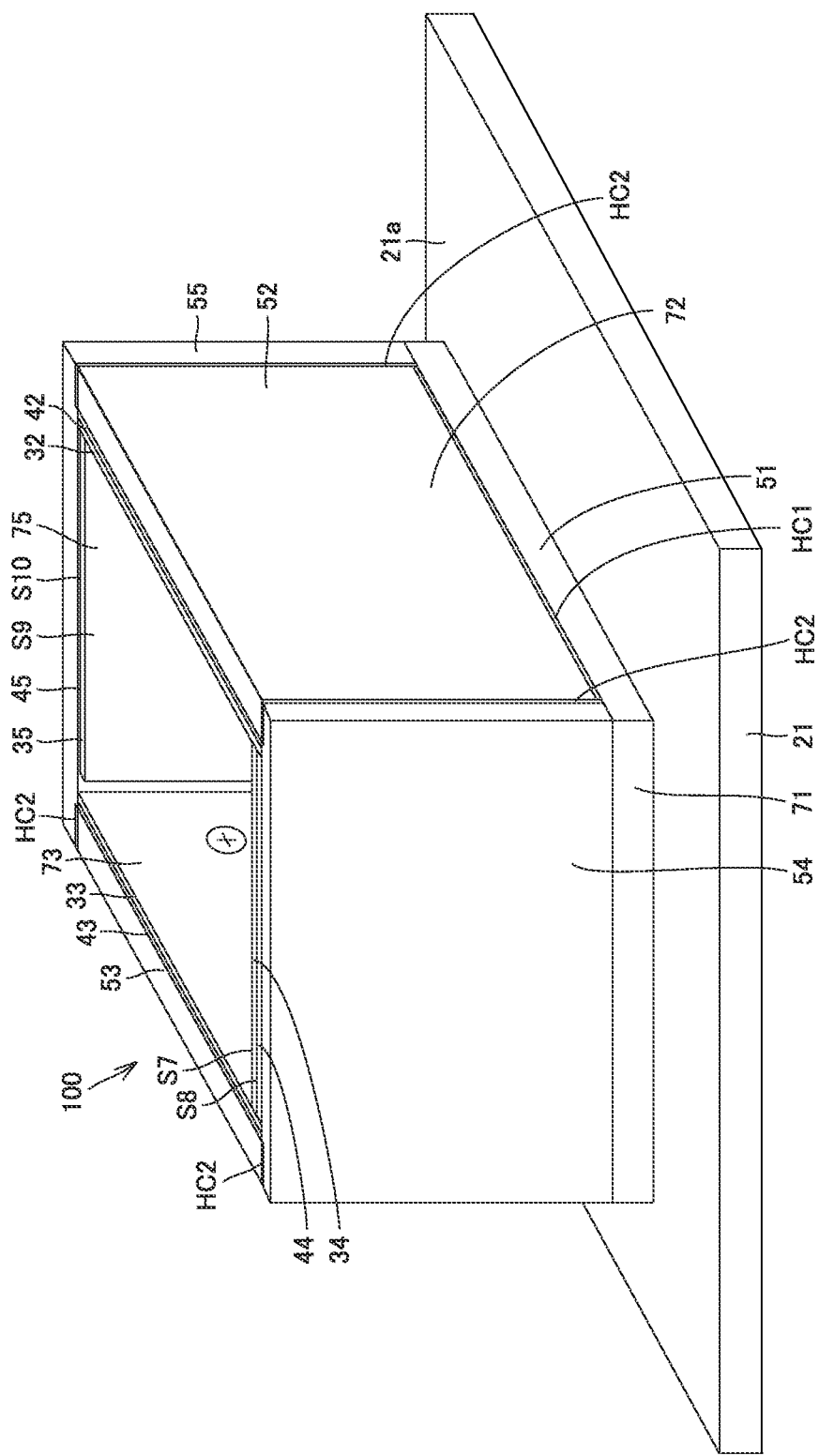
FIG. 22 is a perspective view schematically illustrating a configuration of a first modification of the power conversion device according to the third embodiment.

As illustrated in FIG. 21, fifth printed board module 75 includes fifth printed board 35, fifth insulating member 45, fifth cooling body 55, fifth fixing member 65, and the electronic component (fifth component). The electronic component (fifth component) is mounted on fifth printed board 35. The electronic component (fifth component) is particularly reactor 7 that is the high-heat generating component. Fifth insulating member 45 is disposed between fifth printed board 35 and fifth cooling body 55. Fifth fixing member 65 fixes fifth printed board 35 to fifth cooling body 55. Fifth insulating member 45 is preferably in surface contact with fifth printed board 35 and fifth cooling body 55.

Smoothing capacitor 8 and reactor 7 are mounted on surface 35a of fifth printed board 35 opposite to the surface facing fifth cooling body 55. Output terminal 10 (not illustrated) is mounted on surface 35a. Other electronic components may be mounted on surface 35a. The surface of fifth printed board 35 facing fifth cooling body 55 corresponds to tenth principal surface S10. Surface 35a of fifth printed board 35 opposite to the surface facing fifth cooling body 55 corresponds to ninth principal surface S9. Other electronic components may be mounted on the surface of fifth printed board 35 facing fifth cooling body 55.

Even in this case, power conversion device 100 of the third embodiment can obtain the effect equivalent to that of power conversion device 100 of the second embodiment. Furthermore, in power conversion device 100 of the third embodiment, a fourth heat dissipation path dissipating the heat to external cooling body 21 can be formed through fourth printed board 34, fourth insulating member 44, fourth cooling body 54, and first cooling body 51 as a heat dissipation path dissipating the heat generated by the circuit pattern formed on the surface or inside of fourth printed board 34 and the heat generated by smoothing capacitor 8 and reactor 6, which are the high-heat generating components mounted on fourth printed board 34. The length of the heat dissipation path can be shortened because the fourth heat dissipation path does not include the plate-shaped substrate installation portion as compared with the configuration described in PTL 1, so that heat dissipation can be improved. For this reason, the heat dissipation of power conversion device 100 can be improved with respect to the heat generated by the circuit pattern formed on the surface or inside of fourth printed board 34 and the heat generated by the high-heat generating component mounted on fourth printed board 34. As a result, power conversion device 100 of the third embodiment can operate with high output.

The area of the contact surface between fourth insulating member 44 and fourth printed board 34 and the area of the contact surface between fourth insulating member 44 and fourth cooling body 54 can be increased when fourth insulating member 44 is brought into surface contact with fourth printed board 34 and fourth cooling body 54. For this reason, the contact thermal resistance of the contact surface between fourth insulating member 44 and fourth printed board 34 and the contact thermal resistance of the contact surface between fourth insulating member 44 and fourth cooling body 54 can be reduced, so that the heat dissipation of the fourth heat dissipation path can be improved. As a result, power conversion device 100 of the third embodiment can operate with high output.

A fifth heat dissipation path dissipating the heat to external cooling body 21 can be formed through fifth printed board 35, fifth insulating member 45, fifth cooling body 55, and first cooling body 51 as a heat dissipation path dissipating the heat generated by the circuit pattern formed on the surface or inside of fifth printed board 35 and the heat generated by smoothing capacitor 8 and reactor 7, which are the high-heat generating components mounted on fifth printed board 35. The length of the heat dissipation path can be shortened because the fifth heat dissipation path does not include the plate-shaped substrate installation portion as compared with the configuration described in PTL 1, so that heat dissipation can be improved. For this reason, the heat dissipation of power conversion device 100 can be improved with respect to the heat generated by the circuit pattern formed on the surface or inside of fifth printed board 35 and the heat generated by the high-heat generating component mounted on fifth printed board 35. As a result, power conversion device 100 of the third embodiment can operate with high output.

When fifth insulating member 45 is brought into surface contact with fifth printed board 35 and fifth cooling body 55, the area of the contact surface between fifth insulating member 45 and fifth printed board 35 and the area of the contact surface between fifth insulating member 45 and fifth cooling body 55 can be widened, so that the contact thermal resistance of the contact surface between fifth insulating member 45 and fifth printed board 35 and the contact thermal resistance of the contact surface between fifth insulating member 45 and fifth cooling body 55 can be reduced to improve the heat dissipation of the fifth heat dissipation path. As a result, power conversion device 100 of the third embodiment can operate with high output.

Preferably a thickness of fourth cooling body 54 is increased in a direction substantially perpendicular to surface 34a of fourth printed board 34. Consequently, the heat dissipation can be improved because the thermal resistance of fourth cooling body 54 included in the fourth heat dissipation path can be reduced.

Preferably a thickness of fifth cooling body 55 is increased in a direction substantially perpendicular to surface 35a of fifth printed board 35. Consequently, the heat dissipation can be improved because the thermal resistance of fifth cooling body 55 included in the fifth heat dissipation path can be reduced.

Figure 31:
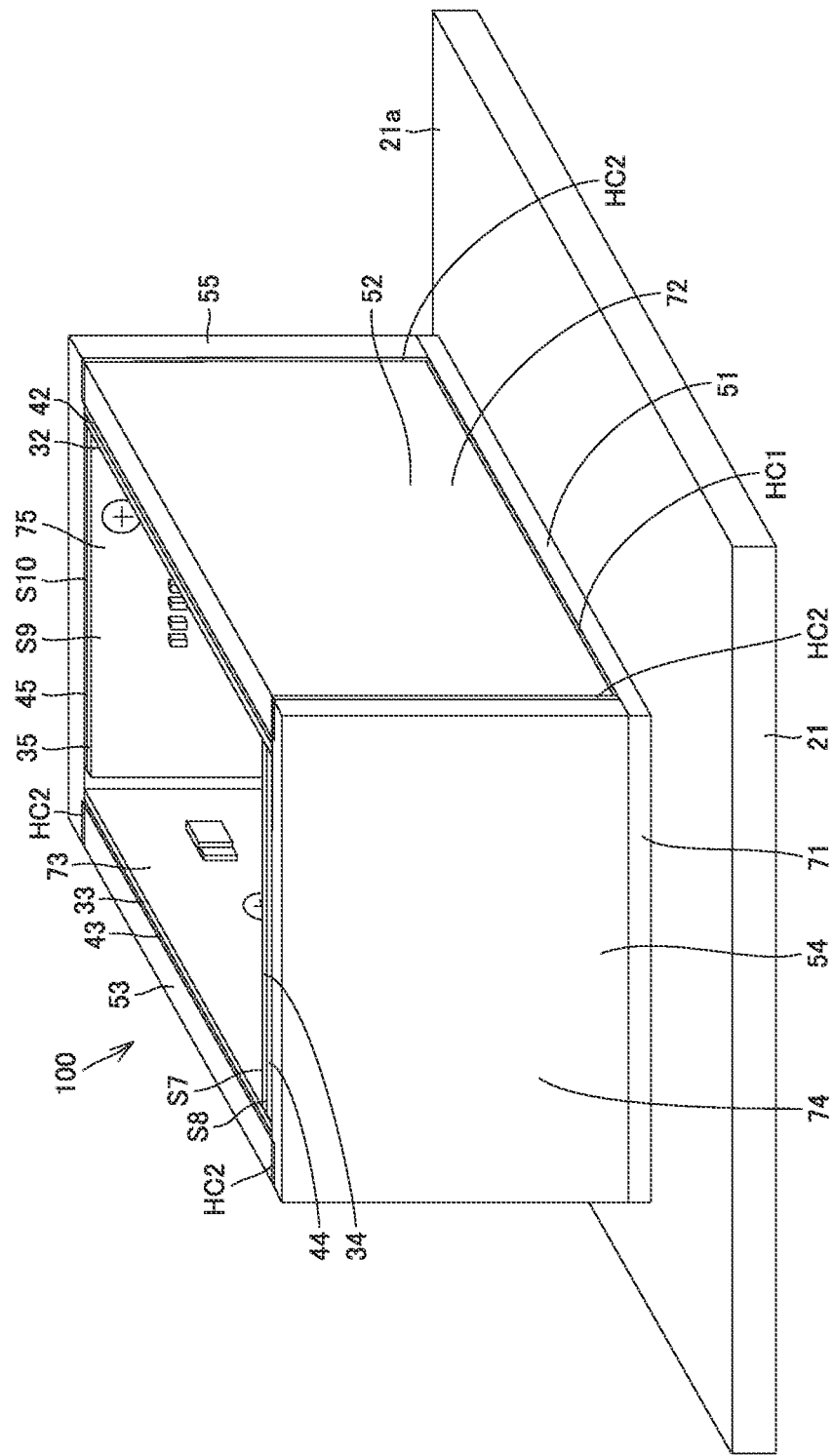
FIG. 31 is a perspective view schematically illustrating a configuration of a second modification of the power conversion device according to the third embodiment.

That is, referring to FIG. 31, preferably each of fourth cooling body 54 and fifth cooling body 55 in the direction orthogonal to the direction from second principal surface S2 toward first principal surface S1 of first printed board 31 is thicker than first cooling body 51 in the direction in which second principal surface S2 is opposite to first principal surface S1.

A high-heat generating component can be mounted on each of fourth printed board 34 and fifth printed board 35 in addition to first printed board 31, second printed board 32, and third printed board 33. Consequently, thermal interference of the heat generated in each high-heat generating component can be suppressed because the distance between the high-heat generating components mounted on the printed board can be increased, so that the heat dissipation of power conversion device 100 can be improved with respect to the heat generated in each high-heat generating component. As a result, power conversion device 100 of the third embodiment can operate with high output.

The electronic component can also be mounted on each of fourth printed board 34 and fifth printed board 35 in addition to first printed board 31, second printed board 32, and third printed board 33. For this reason, because a component mounting area is increased, first printed board 31, second printed board 32, and third printed board 33 can be downsized as compared with the first and second embodiments. As a result, power conversion device 100 of the third embodiment can be downsized.

The electronic components mounted on first printed board 31, second printed board 32, third printed board 33, fourth printed board 34, and fifth printed board 35 included in power conversion device 100 of the third embodiment may be interchanged. For example, power conversion device 100 of the third embodiment may be configured as illustrated in FIGS. 22 to 27. Examples of first printed board module 71, second printed board module 72, third printed board module 73, fourth printed board module 74, and fifth printed board module 75 in FIGS. 23 to 27 will be described below.

Figure 23:
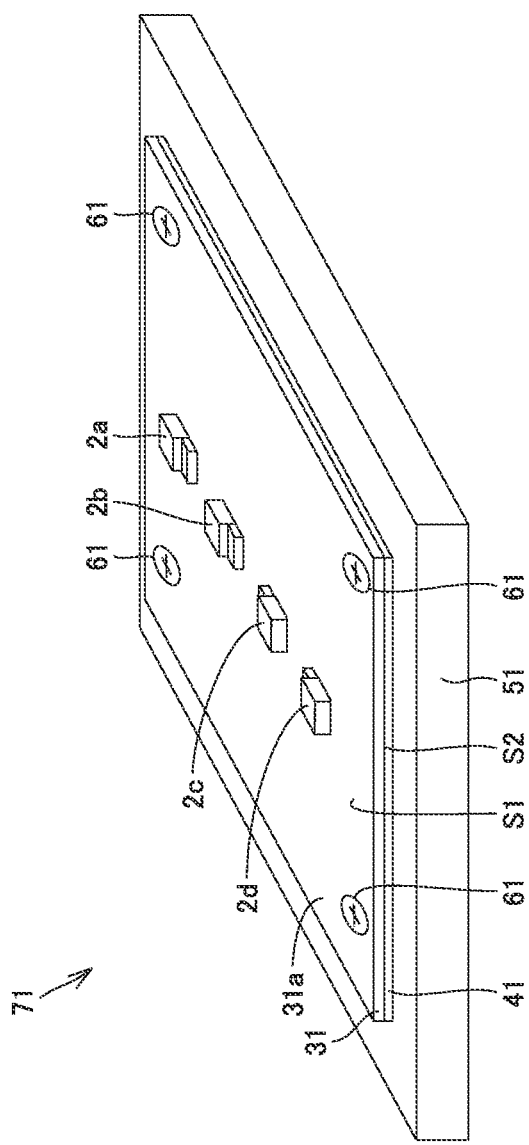
FIG. 23 is a perspective view schematically illustrating a configuration of a first printed board module in the first modification of the power conversion device of the third embodiment.

As illustrated in FIG. 23, switching elements 2a, 2b, 2c, 2d are mounted on surface 31a of first printed board 31 opposite to the surface facing first cooling body 51. Other electronic components may be mounted on surface 31a. Other electronic components may be mounted on the surface of first printed board 31 facing first cooling body 51.

Figure 24:
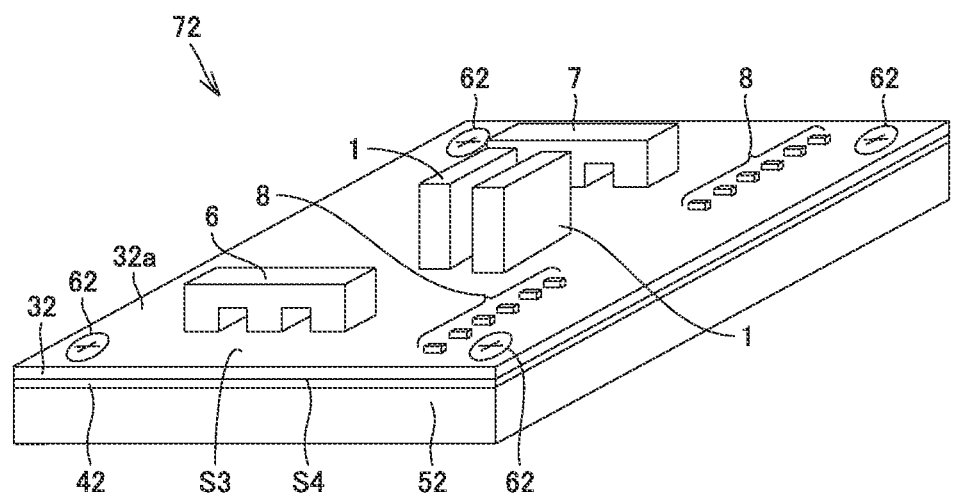
FIG. 24 is a perspective view schematically illustrating a configuration of a second printed board module in the first modification of the power conversion device of the third embodiment.

As illustrated in FIG. 24, input capacitor 1, reactors 6, 7, and smoothing capacitor 8 are mounted on surface 32a of second printed board 32 opposite to the surface facing second cooling body 52. Input terminal 9 (not illustrated) is mounted on surface 32a. Other electronic components may be mounted on surface 32a. Other electronic components may be mounted on the surface of second printed board 32 facing second cooling body 52.

Figure 25:
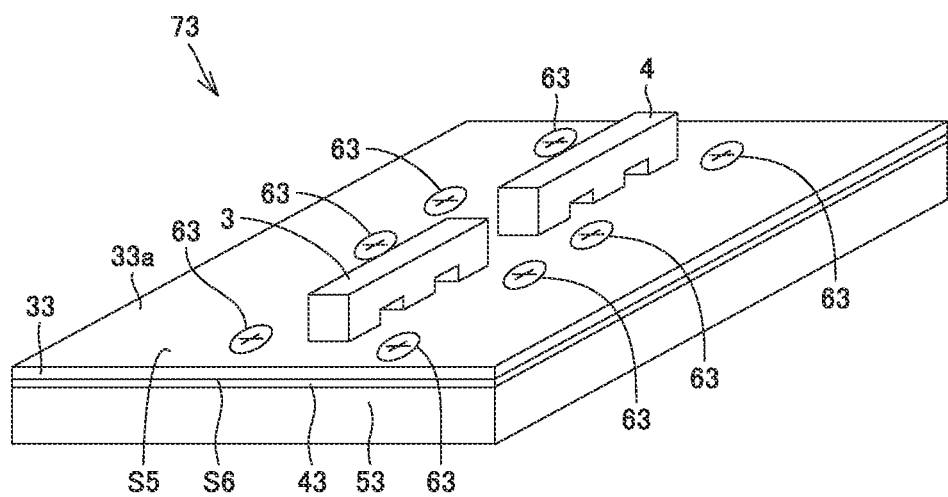
FIG. 25 is a perspective view schematically illustrating a configuration of a third printed board module in the first modification of the power conversion device of the third embodiment.

As illustrated in FIG. 25, transformers 3, 4 are mounted on surface 33a of third printed board 33 opposite to the surface facing third cooling body 53. Other electronic components may be mounted on surface 33a. Other electronic components may be mounted on the surface of third printed board 33 facing third cooling body 53.

Figure 26:
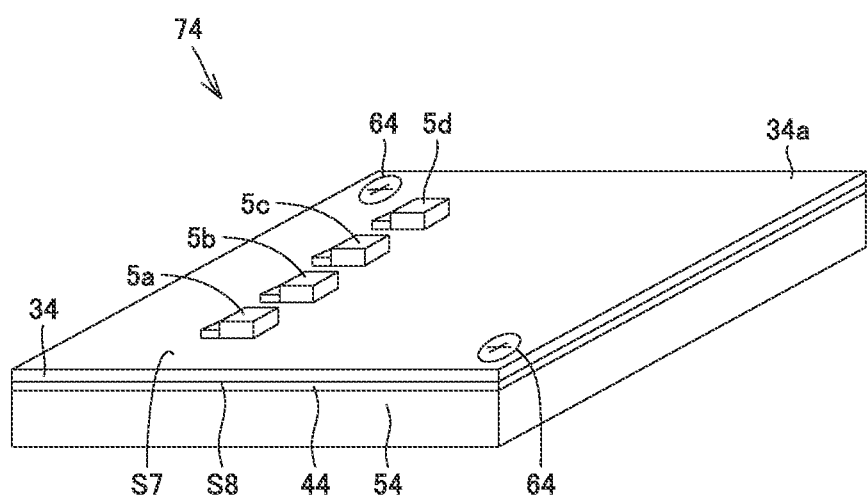
FIG. 26 is a perspective view schematically illustrating a configuration of a fourth printed board module in the first modification of the power conversion device of the third embodiment.

As illustrated in FIG. 26, rectifier elements 5a, 5b, 5c, 5d are mounted on surface 34a of fourth printed board 34 opposite to the surface facing fourth cooling body 54. Other electronic components may be mounted on surface 34a. Other electronic components may be mounted on the surface of fourth printed board 34 facing fourth cooling body 54.

Figure 27:
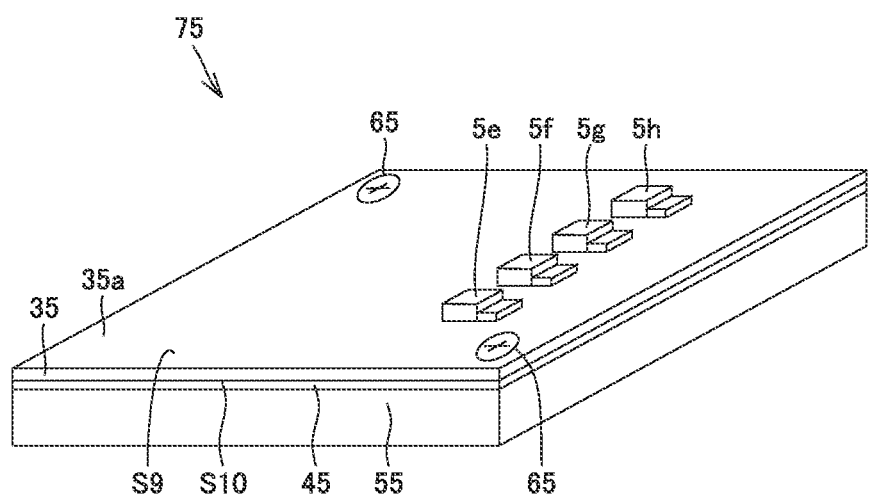
FIG. 27 is a perspective view schematically illustrating a configuration of a fifth printed board module in the first modification of the power conversion device of the third embodiment.

As illustrated in FIG. 27, rectifier elements 5e, 5f, 5g, 5h are mounted on surface 35a of fifth printed board 35 opposite to the surface facing fifth cooling body 55. Other electronic components may be mounted on surface 35a. Other electronic components may be mounted on the surface of fifth printed board 35 facing fifth cooling body 55.

Power conversion device 100 of the third embodiment may not include fifth printed board 35, fifth insulating member 45, and fifth fixing member 65. In other words, power conversion device 100 may include external cooling body 21, first printed board module 71, the second printed board module 72, third printed board module 73, fourth printed board module 74, and fifth cooling body 55. First printed board module 71, second printed board module 72, third printed board module 73, and fourth printed board module 74 are electrically connected to one another by a harness or the like.

The electronic components disposed in first printed board module 71, second printed board module 72, third printed board module 73, fourth printed board module 74, and fifth printed board module 75 may be exchanged, but preferably the high-heat generating component is particularly disposed in first printed board module 71.

Fourth Embodiment

Figure 28:
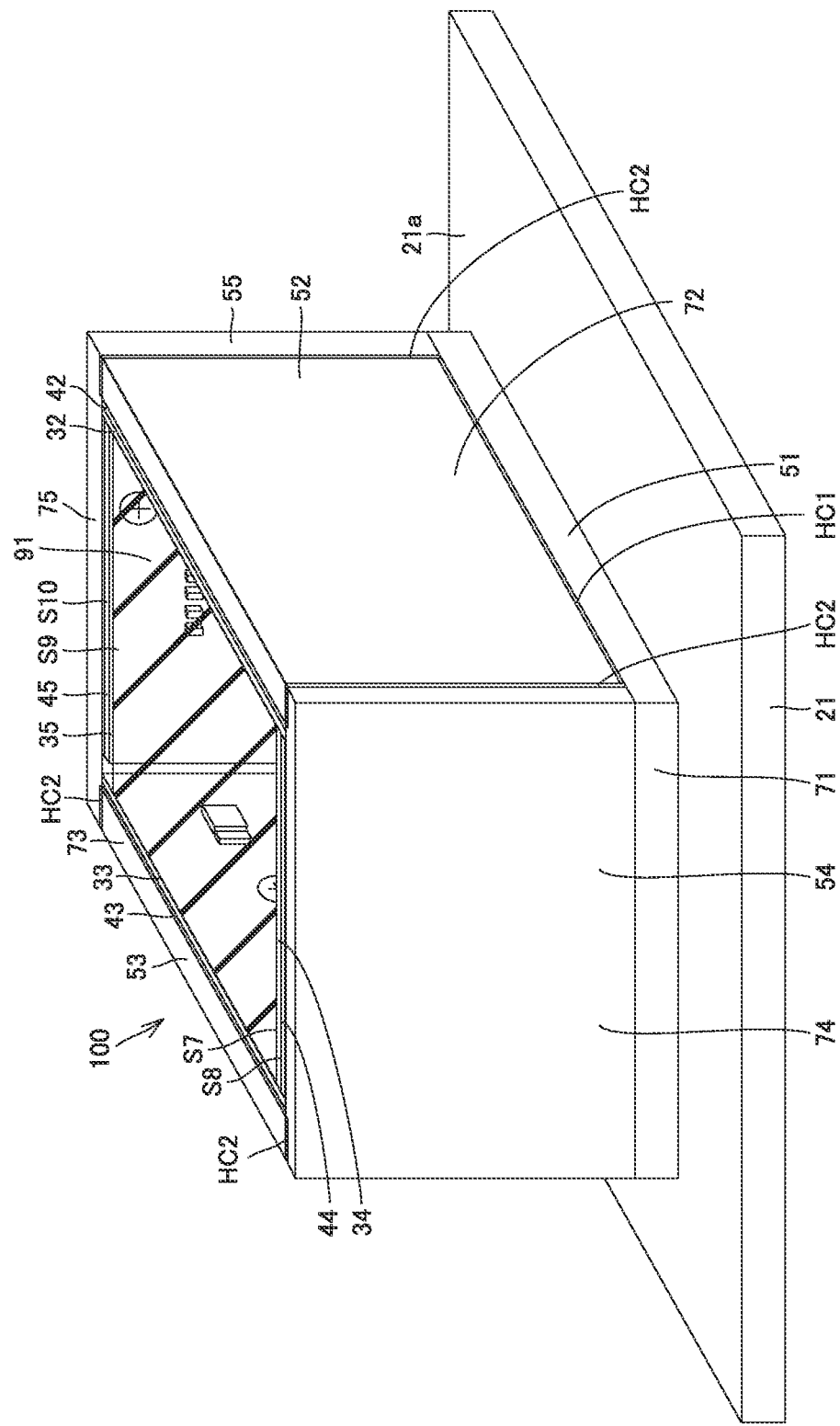
FIG. 28 is a perspective view schematically illustrating a configuration of a power conversion device according to a fourth embodiment.

With reference to FIG. 28, a power conversion device 100 according to a fourth embodiment will be described below. The fourth embodiment has the same configuration, operation, and effect as those of the second embodiment or the third embodiment described above unless otherwise specified. Consequently, the same components as those in the second or third embodiment are denoted by the same reference numerals, and the description thereof will not be repeated.

Power conversion device 100 of the fourth embodiment basically has the same configuration as power conversion device 100 of the second embodiment or the third embodiment. Power conversion device 100 of the fourth embodiment is different in that a space substantially surrounded by first cooling body 51, second cooling body 52, third cooling body 53, fourth cooling body 54, and fifth cooling body 55 is filled with a sealing member 91.

Power conversion device 100 of the fourth embodiment includes sealing member 91. The space surrounded by first cooling body 51, second cooling body 52, third cooling body 53, fourth cooling body 54, and fifth cooling body 55 is filled with sealing member 91. Sealing member 91 seals the electronic components mounted on first printed board 31, second printed board 32, third printed board 33, fourth printed board 34, and fifth printed board 35.

Sealing member 91 may be made of a material having the thermal conductivity greater than or equal to 0.1 W/(m·K), preferably 1.0 W/(m·K). Sealing member 91 is made of a material having volume resistivity greater than or equal to $1 \times 10^{10}$ Ω·m, preferably greater than or equal to $1 \times 10^{12}$ Ω·m, and more preferably greater than or equal to $1 \times 10^{14}$ Ω·m. In other words, sealing member 91 has the electric insulation property. Sealing member 91 may have the Young's modulus greater than or equal to 1 MPa. Sealing member 91 may be made of a resin material having elasticity. Sealing member 91 may be made of a resin material such as polyphenylene sulfide (PPS) and polyether ether ketone (PEEK), which are contain a thermally conductive filler. Sealing member 91 may be made of a rubber material such as silicon or urethane.

A method for manufacturing power conversion device 100 of the fifth embodiment will be described below.

The fourth component and the fifth component included in the electronic components, fourth printed board 34 and fifth printed board 35, and fourth cooling body 54 and fifth cooling body 55 are prepared in preparation step S100 of FIG. 10.

In assembly step S200, the electronic component (fourth components) is mounted on seventh principal surface S7 of fourth printed board 34, and fourth cooling body 54 is thermally connected to eighth principal surface S8 opposite to seventh principal surface S7 of fourth printed board 34. The electronic component (fifth component) is mounted on ninth principal surface S9 of fifth printed board 35, and fifth cooling body 55 is thermally connected to tenth principal surface S10 opposite to ninth principal surface S9 of fifth printed board 35.

In connection step S300, fourth cooling body 54 and fifth cooling body 55 are disposed so as to extend in the direction from second principal surface S2 toward first principal surface S1 of first printed board 31. A space surrounded by first cooling body 51, second cooling body 52, third cooling body 53, fourth cooling body 54, and fifth cooling body 55 is filled with sealing member 91.

Even in this case, the power conversion device 100 according to the fourth embodiment can obtain the same effects as those of power conversion devices 100 of the second and third embodiments. Furthermore, in power conversion device 100 of the fourth embodiment, a heat dissipation path dissipating the heat to external cooling body 21 can be formed through sealing member 91, first cooling body 51, second cooling body 52, third cooling body 53, fourth cooling body 54, and fifth cooling body 55 as a heat dissipation path dissipating the heat generated by the circuit pattern formed on the surface or inside of the printed board and the heat generated by the high-heat generating component mounted on the printed board. For this reason, the heat dissipation of power conversion device 100 can be improved with respect to the heat generated in the circuit pattern formed on the surface or inside of the printed board and the heat generated in the high-heat generating component mounted on the printed board. As a result, power conversion device 100 can operate with high output.

In general, in order to prevent the creeping discharge between the electronic components, it is necessary to secure a creeping distance according to a voltage applied to each electronic component between the electronic components. In power conversion device 100 of the fourth embodiment, creeping discharge hardly occurs because sealing member 91 having the electric insulation property fills the space between the electronic components. Consequently, a creeping distance between the electronic components can be shortened. For this reason, power conversion device 100 of the fourth embodiment can downsize first printed board 31, second printed board 32, and third printed board 33 as compared with power conversion device 100 according to the first to third embodiments. As a result, power conversion device 100 of the fourth embodiment can be downsized.

When sealing member 91 fills the space between the printed board and the cooling body, the necessity of the insulating member disposed between the printed board and the cooling body can be eliminated. Therefore, the number of components constituting power conversion device 100 can be reduced.

Fifth Embodiment

Figure 29:
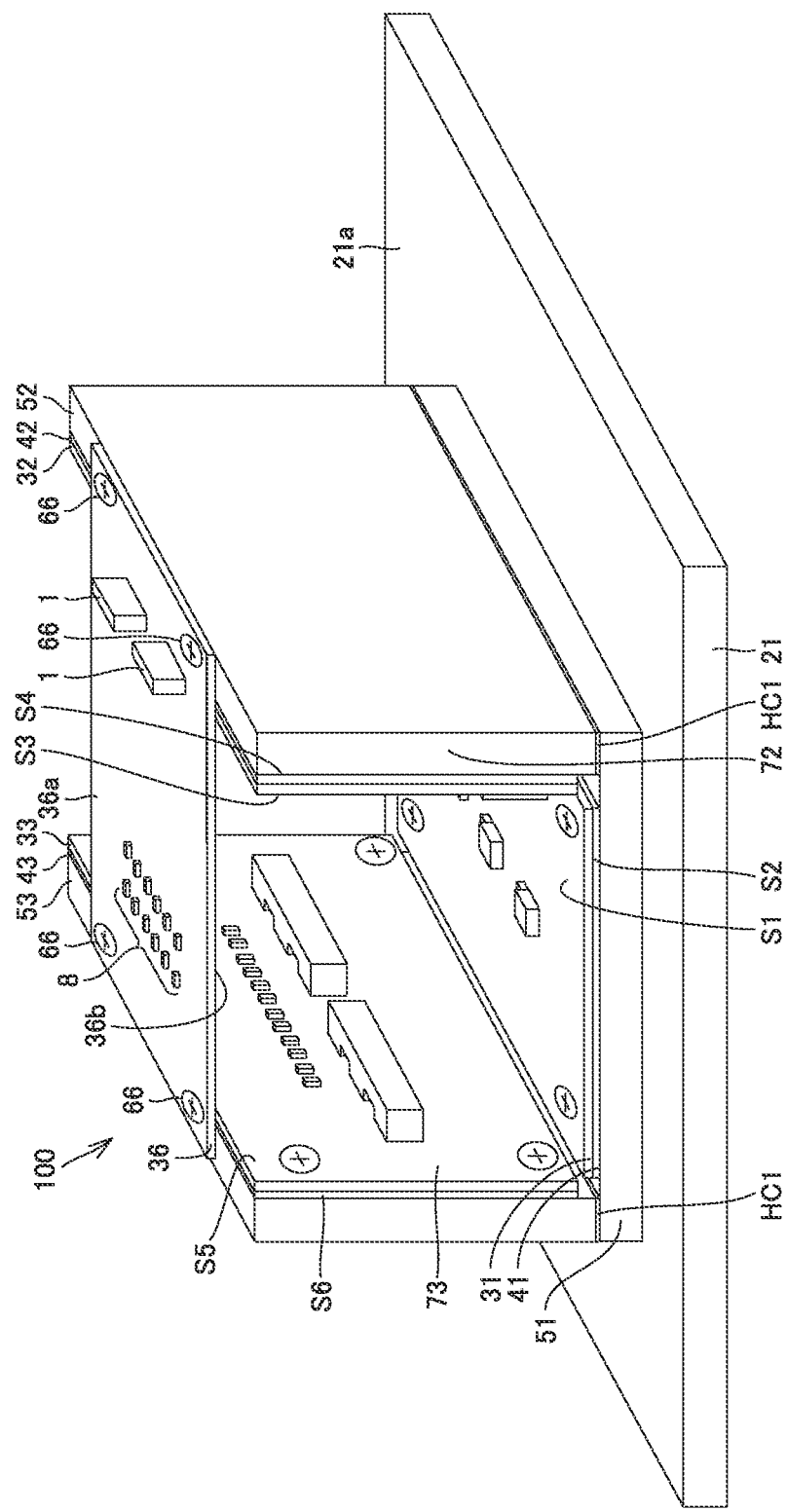
FIG. 29 is a perspective view schematically illustrating a configuration of a power conversion device according to a fifth embodiment.

With reference to FIG. 29, a power conversion device 100 according to a fifth embodiment will be described below. The fifth embodiment has the same configuration, operation, and effect as those of the first to fourth embodiments unless otherwise specified. Consequently, the same components as those of the first to fourth embodiments are denoted by the same reference numerals, and the description thereof will not be repeated.

Power conversion device 100 of the fifth embodiment basically has the same configuration as power conversion device 100 of the first to fourth embodiments. Power conversion device 100 of the fifth embodiment is different from power conversion device 100 of the first to fourth embodiments in that power conversion device 100 of the fifth embodiment includes a sixth printed board (sixth substrate) 36, an electronic component (sixth component) mounted on sixth printed board 36, and a sixth fixing member 66.

Power conversion device 100 of the fifth embodiment includes the electronic component (sixth component) and the sixth printed board (sixth substrate) on which the electronic component (sixth component) is mounted.

Sixth fixing member 66 fixes sixth printed board 36 to at least one of second cooling body 52, third cooling body 53, fourth cooling body, and fifth cooling body 55. Sixth printed board 36 is fixed to at least one of first cooling body 51, second cooling body 52, third cooling body 53, fourth cooling body 54, and fifth cooling body 55 by sixth fixing member 66. For example, as illustrated in FIG. 29, sixth printed board 36 may be fixed to second cooling body 52 and third cooling body 53 by sixth fixing member 66. In this case, sixth printed board 36 is fixed to second cooling body 52 and third cooling body 53 in connection step S300 of FIG. 10.

The components that are not the high-heat generating components included in power conversion device 100, such as input capacitor 1, smoothing capacitor 8, and control circuit unit 15 (not illustrated) are mounted on a surface 36a of sixth printed board 36 opposite to the surface facing first cooling body 51. The calorific value of the electronic component (sixth component) mounted on sixth printed board 36 is smaller than the calorific value of each of the electronic component (first component) mounted on first printed board 31, the electronic component (second component) mounted on second printed board 32, and the electronic component (third component) mounted on third printed board 33. These calorific values are calorific values during the operation of power conversion device 100. Input terminal 9 and output terminal 10 (not illustrated) are mounted on surface 36a. A part or all of the electronic components mounted on surface 36a of sixth printed board 36 may be mounted on a surface 36b opposite to surface 36a of sixth printed board 36.

Even in this case, power conversion device 100 of the fifth embodiment can obtain the same effects as those of power conversion device 100 of the first to fourth embodiments. In general, the components that are not the high-heat generating components, for example, input capacitor 1, smoothing capacitor 8, and control circuit unit 15 (not illustrated) have lower-heat resistance temperatures than the high-heat generating components. For this reason, when the high-heat generating component and the component that is not the high-heat generating component are mounted on the same printed board, it is necessary to perform the thermal design such that a temperature of the component that is not the high-heat generating component does not exceed an allowable temperature due to the heat generated by the high-heat generating component. In power conversion device 100 of the fifth embodiment, because the component that is not the high-heat generating component is mounted on the printed board different from the high-heat generating component, it is not necessary to perform the thermal design such that the temperature of the component that is not the high-heat generating component does not exceed the allowable temperature due to the heat generated in the high-heat generating component.

Sixth Embodiment

Figure 33:
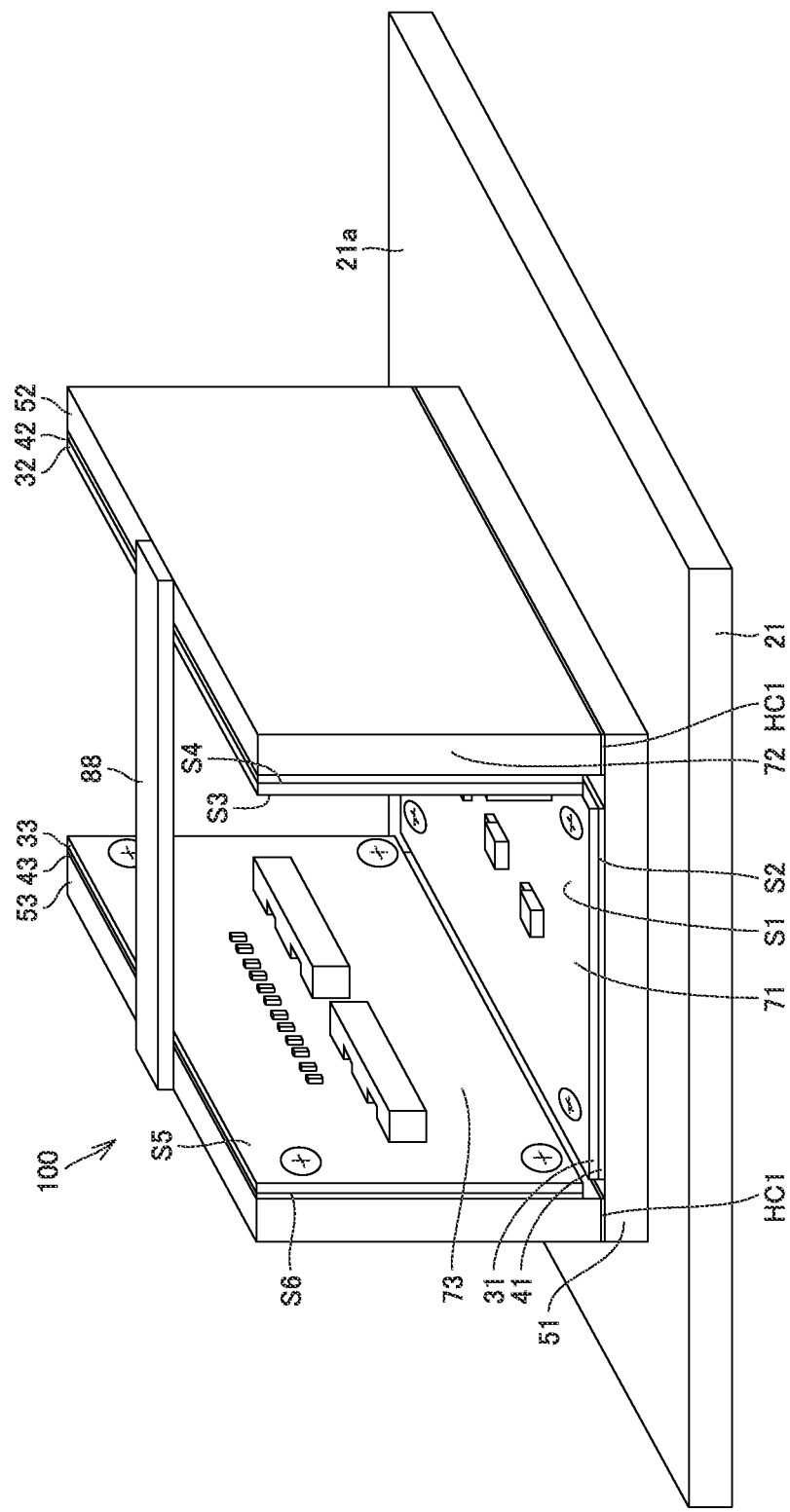
FIG. 33 is a perspective view schematically illustrating a configuration of a power conversion device according to a sixth embodiment.
Figure 34:
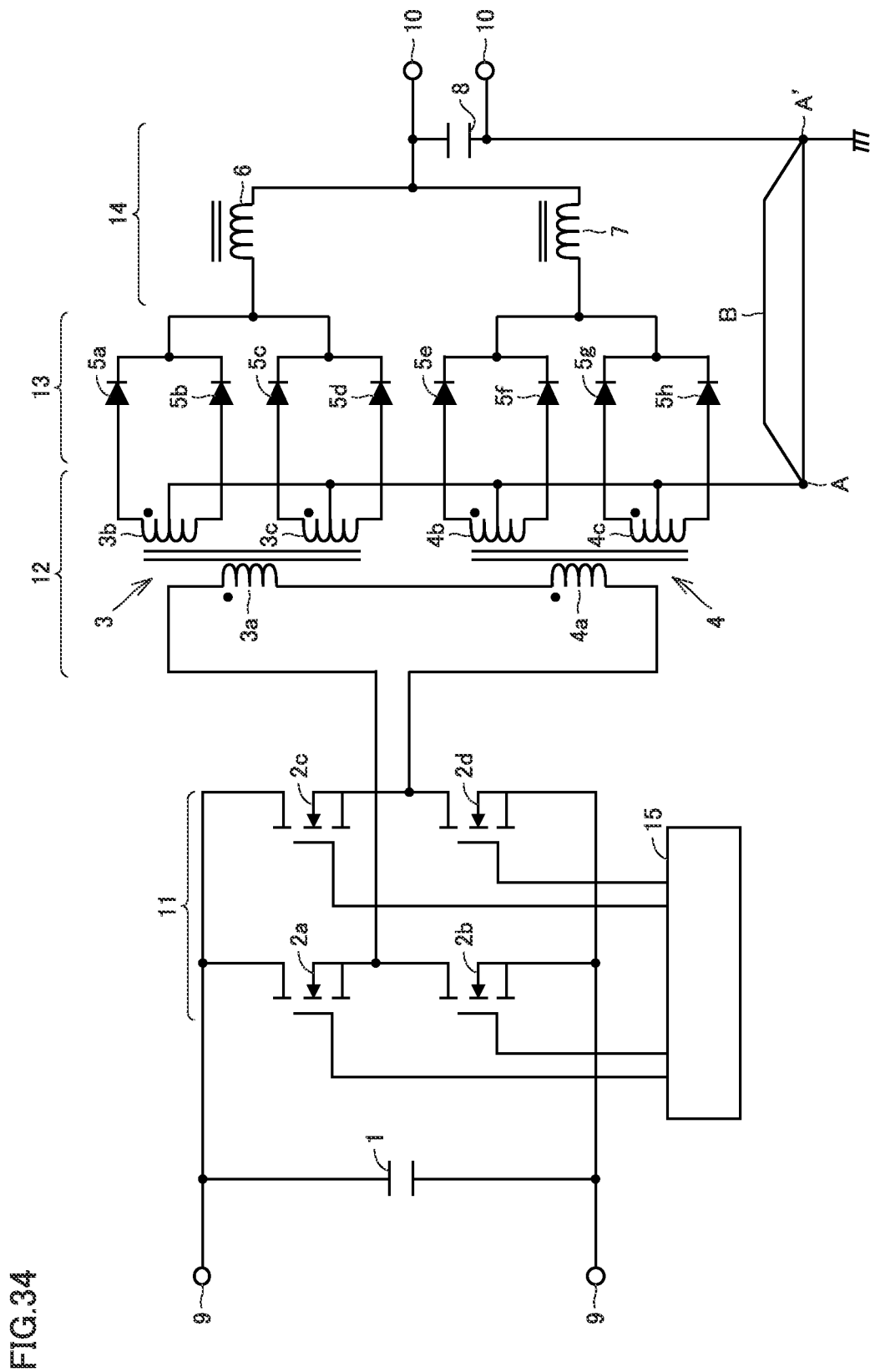
FIG. 34 is a circuit diagram illustrating the power conversion device of the sixth embodiment.

With reference to FIGS. 33 and 34, a power conversion device 100 according to a sixth embodiment will be described below. The sixth embodiment has the same configuration, operation, and effect as those of the first embodiment described above unless otherwise specified. Consequently, the same components as those in the first embodiment are denoted by the same reference numerals, and the description thereof will not be repeated.

Power conversion device 100 of the sixth embodiment basically has the same configuration as power conversion device 100 of the first embodiment. Power conversion device 100 of the sixth embodiment is different from power conversion device 100 of the first embodiment in that power conversion device 100 of the sixth embodiment includes a low-resistance current path member (current path member) 88.

Low-resistance current path member 88 is formed of any conductive material such as copper or nickel or gold or aluminum or silver or tin, or an alloy thereof. Low-resistance current path member 88 has volume resistivity less than or equal to $1.0 \times 10^{-6}$ Ω·m, preferably less than or equal to $1.0 \times 10^{-7}$ Ω·m. A part or all of first cooling body 51, second cooling body 52, and third cooling body 53 form a current path (first energization path) A-A'.

As illustrated in FIG. 34, low-resistance current path member 88 forms a current path (second energization path) B electrically connected in parallel to current path A-A' including a part or all of first cooling body 51, second cooling body 52, and third cooling body 53.

Specific examples of current path A-A' and current path B will be described below. For example, as illustrated in FIG. 33, current path A-A' includes third cooling body 53, first cooling body 51, and second cooling body 52, and electrically connects third printed board 33 and second printed board 32. At this point, for example, as illustrated in FIG. 33, current path B may be constructed with third cooling body 53, low-resistance current path member 88, and second cooling body 52 so as to electrically connect third printed board 33 and second printed board 32.

The electric resistance of current path B formed from low-resistance current path member 88 is desirably lower than the electric resistance of current path A-A'. A material constituting current path B and a shape of current path B can be determined independently of a material and a shape of current path A-A' including a part or all of first cooling body 51, second cooling body 52, and third cooling body 53. Consequently, when current path A-A' is made of aluminum, the electric resistance of current path B can be made smaller than the electric resistance of the current path A-A' by forming current path B with a conductor, for example, copper having volume resistivity smaller than that of aluminum. The path length of current path B is made shorter than the path length of current path A-A', or the sectional area of current path B is made larger than the sectional area of current path A-A', whereby the electric resistance of current path B can be made smaller than the electric resistance of current path A-A'.

Even in this case, power conversion device 100 of the sixth embodiment can obtain the same effects as those of power conversion device 100 of the first embodiment.

Figure 32:
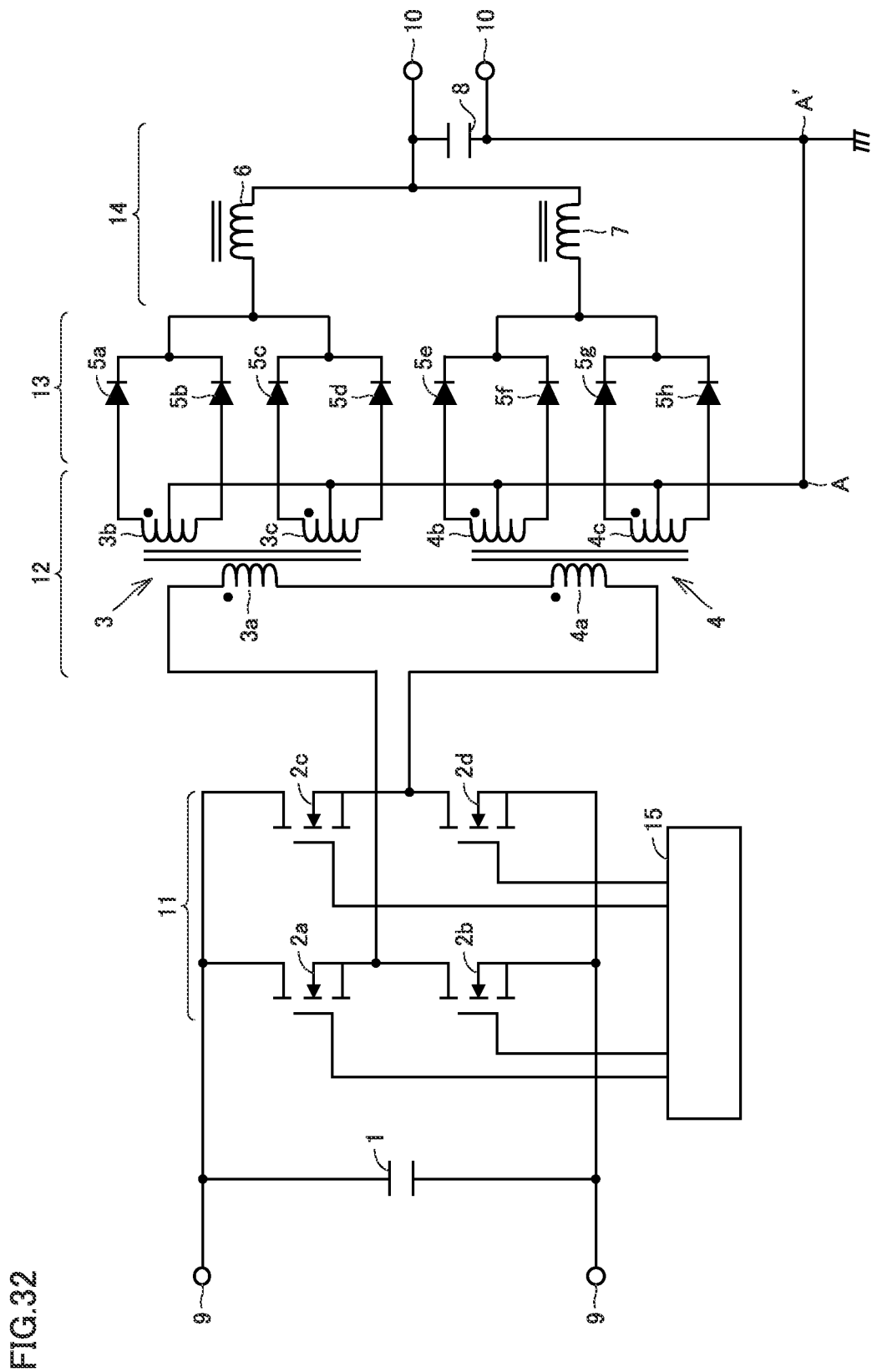
FIG. 32 is a circuit diagram illustrating a sixth modification of the power conversion device of the first embodiment.

In power conversion device 100 of the first embodiment, when first cooling body 51, second cooling body 52, and third cooling body 53 are used as, for example, current path A-A' in FIG. 32, the current flows through first cooling body 51, second cooling body 52, and third cooling body 53. At this point, the temperatures of first cooling body 51, second cooling body 52, and third cooling body 53 increase because Joule heating proportional to the square of the current value is generated in first cooling body 51, second cooling body 52, and third cooling body 53. As a result, as the temperatures of first cooling body 51, second cooling body 52, and third cooling body 53 increase, the temperatures of the high-heat generating components mounted on first printed board 31, second printed board 32, and third printed board 33 also increase, so that the heat dissipation decreases to the high-heat generating components mounted on first printed board 31, second printed board 32, and third printed board 33 of power conversion device 100 of the first embodiment.

On the other hand, in power conversion device 100 of the sixth embodiment, low-resistance current path member 88 forms current path B electrically connected in parallel to current path A-A'. For this reason, a part of the current flowing through current path A-A' is divided into current path B. As a result, the current flowing through current path A-A' decreases, and Joule heating generated in first cooling body 51, second cooling body 52, and third cooling body 53 decreases. As a result, in power conversion device 100 of the first embodiment, as compared with the case that first cooling body 51, second cooling body 52, and third cooling body 53 are used as, for example, current path A-A' in FIG. 32, the heat dissipation can be improved with respect to the high-heat generating component mounted on first printed board 31, second printed board 32, and third printed board 33.

In addition, the larger the amount of current diverted to current path B is increased in the current flowing through current path A-A' as the electric resistance of current path B formed by low-resistance current path member 88 is decreased than the electric resistance of current path A-A'. For example, when the electric resistance of current path B is a half of the electric resistance of current path A-A', the amount of current flowing through current path A-A' is reduced to one third as compared with the case where current path B does not exist. Consequently, because the Joule heating is proportional to the square of the current value, the heating of current path A-A' is reduced to one ninth as compared with the case where the current path B is not provided.

Although only one low-resistance current path member 88 is illustrated in FIG. 33, a plurality of current paths B electrically connected in parallel to current path A-A' may be formed by combining a plurality of low-resistance current path members 88.

In addition, the above-described embodiments can be appropriately combined.

It should be considered that the disclosed embodiment is an example in all respects and not restrictive. The scope of the present disclosure is defined by not the description above, but the claims, and it is intended that all modifications within the meaning and scope of the claims and their equivalents are included in the present invention.

REFERENCE SIGNS LIST

21: external cooling body, 31: first printed board, 32: second printed board, 33: third printed board, 34: fourth printed board, 35: fifth printed board, 36: sixth printed board, 41 to 45: first insulating member to fifth insulating member, 51 to 55: first cooling body to fifth cooling body, 61 to 66: first fixing member to sixth fixing member, 71 to 75: first printed board module to fifth printed board module, 81: upper core, 82: core, 83: spring, 84: strut, 85: pressing plate, 86: harness, 87: terminal block, 88: low-resistance current path member, 91: sealing member, 100: power conversion device, HC1: first heat conductive member, HC2: second heat conductive member, S1 to S10: first principal surface to tenth principal surface, S100: preparation step, S200: assembly step, S300: connection step

The invention claimed is:

1. A power conversion device comprising:
an electronic component including a first component and a second component;
a first substrate including a first principal surface on which the first component of the electronic component is mounted and a second principal surface opposite to the first principal surface;
a first cooling body thermally connected to the second principal surface of the first substrate;
a second substrate including a third principal surface on which the second component of the electronic component is mounted and a fourth principal surface opposite to the third principal surface; and
a second cooling body thermally connected to the fourth principal surface of the second substrate, wherein
the first cooling body forms a bottom surface of a support body,
the second cooling body forms a side surface of the support body,
the second cooling body extends in a direction from the second principal surface of the first substrate toward the first principal surface, and
the second substrate is disposed on a surface of the second cooling body facing the first substrate.

2. The power conversion device according to claim 1, further comprising an external cooling body thermally connected to the first cooling body, wherein
each of the first cooling body and the second cooling body is formed in a plate shape, and
a thickness of the first cooling body in a direction in which the second principal surface is opposite to the first principal surface is thinner than a thickness of the second cooling body in a direction in which the fourth principal surface is opposite to the third principal surface.

3. A power conversion device comprising:
an electronic component including a first component, a second component, and a third component;

a first substrate including a first principal surface on which the first component of the electronic component is mounted and a second principal surface opposite to the first principal surface;
a first cooling body thermally connected to the second principal surface of the first substrate;
a second substrate including a third principal surface on which the second component of the electronic component is mounted and a fourth principal surface opposite to the third principal surface;
a second cooling body thermally connected to the fourth principal surface of the second substrate;
a third substrate including a fifth principal surface on which the third component of the electronic component is mounted and a sixth principal surface opposite to the fifth principal surface; and
a third cooling body thermally connected to the sixth principal surface of the third substrate, wherein
the second cooling body extends in a direction from the second principal surface of the first substrate toward the first principal surface,
the third cooling body extends in the direction from the second principal surface of the first substrate toward the first principal surface, and
the second substrate and the third substrate are disposed to face each other.

4. The power conversion device according to claim 3, further comprising an external cooling body thermally connected to the first cooling body, wherein
each of the first cooling body, the second cooling body, and the third cooling body is formed in a plate shape, and
a thickness of the first cooling body in a direction in which the second principal surface is opposite to the first principal surface is thinner than a thickness of the second cooling body in a direction in which the fourth principal surface is opposite to the third principal surface and a thickness of the third cooling body in a direction in which the sixth principal surface is opposite to the fifth principal surface.

5. The power conversion device according to claim 3, further comprising:
a first insulating member disposed between the second principal surface of the first substrate and the first cooling body;
a second insulating member disposed between the fourth principal surface of the second substrate and the second cooling body; and
a third insulating member disposed between the sixth principal surface of the third substrate and the third cooling body, wherein
the first cooling body is thermally connected to the second principal surface of the first substrate through the first insulating member,
the second cooling body is thermally connected to the fourth principal surface of the second substrate through the second insulating member, and
the third cooling body is thermally connected to the sixth principal surface of the third substrate through the third insulating member.

6. The power conversion device according to claim 3, wherein
the second cooling body is thermally connected to the first cooling body, and
the third cooling body is thermally connected to the first cooling body.

7. The power conversion device according to claim 6, further comprising a first heat conductive member, wherein
the first cooling body is thermally connected to each of the second cooling body and the third cooling body through the first heat conductive member.

8. The power conversion device according to claim 3, further comprising:
a fourth cooling body thermally connected to the first cooling body, the second cooling body, and the third cooling body; and
a fifth cooling body thermally connected to the first cooling body, the second cooling body, and the third cooling body, wherein
the fourth cooling body extends in the direction from the second principal surface of the first substrate toward the first principal surface, and
the fifth cooling body extends in the direction from the second principal surface of the first substrate toward the first principal surface.

9. The power conversion device according to claim 8, wherein
each of the fourth cooling body and the fifth cooling body is formed in a plate shape, and
a thickness of each of the fourth cooling body and the fifth cooling body in a direction orthogonal to the direction from the second principal surface of the first substrate toward the first principal surface is thicker than a thickness of the first cooling body in a direction in which the second principal surface is opposite to the first principal surface.

10. The power conversion device according to claim 9, further comprising a second heat conductive member, wherein
the fourth cooling body is thermally connected to each of the first cooling body, the second cooling body, and the third cooling body through the second heat conductive member, and
the fifth cooling body is thermally connected to each of the first cooling body, the second cooling body, and the third cooling body through the second heat conductive member.

11. The power conversion device according to claim 8, wherein
the electronic component includes a fourth component,
the power conversion device further comprises:
a fourth substrate including a seventh principal surface on which the fourth component of the electronic component is mounted and an eighth principal surface opposite to the seventh principal surface; and
a fourth insulating member disposed between the eighth principal surface of the fourth substrate and the fourth cooling body, and
the fourth cooling body is thermally connected to the eighth principal surface of the fourth substrate through the fourth insulating member.

12. The power conversion device according to claim 8, wherein
the electronic component includes a fifth component,
the power conversion device further comprises:
a fifth substrate including a ninth principal surface on which the fifth component of the electronic component is mounted and a tenth principal surface opposite to the ninth principal surface; and
a fifth insulating member disposed between the tenth principal surface of the fifth substrate and the fifth cooling body, and the fifth cooling body is thermally connected to the tenth principal surface of the fifth substrate through the fifth insulating member.

13. The power conversion device according to claim 8, further comprising a sealing member filling a space surrounded by the first cooling body, the second cooling body, the third cooling body, the fourth cooling body, and the fifth cooling body.

14. The power conversion device according to claim 13, wherein the sealing member has volume resistivity greater than or equal to $1\times10^{10}$ Ω·m.

15. The power conversion device according to claim 3, wherein
 the electronic component includes a sixth component,
 the power conversion device further comprises a sixth substrate on which the sixth component of the electronic component is mounted, and
 a calorific value of the sixth component is smaller than a calorific value of each of the first component, the second component, and the third component.

16. The power conversion device according to claim 3, further comprising a current path member, wherein
 a part or all of the first cooling body, the second cooling body, and the third cooling body form a first energization path, and
 the current path member forms a second energization path electrically connected in parallel to the first energization path.

17. The power conversion device according to claim 16, wherein an electric resistance value of the second energization path is lower than an electric resistance value of the first energization path.

* * * * *